(12) United States Patent
Hirabayashi

(10) Patent No.: US 10,725,593 B2
(45) Date of Patent: Jul. 28, 2020

(54) DISPLAY DEVICE

(71) Applicant: Japan Display Inc., Minato-ku (JP)

(72) Inventor: Ken Hirabayashi, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 134 days.

(21) Appl. No.: 15/839,903

(22) Filed: Dec. 13, 2017

(65) Prior Publication Data

US 2018/0164923 A1    Jun. 14, 2018

(30) Foreign Application Priority Data

Dec. 14, 2016  (JP) ................. 2016-241888

(51) Int. Cl.
| | |
|---|---|
| *G06F 3/044* | (2006.01) |
| *G02F 1/1333* | (2006.01) |
| *G06F 3/041* | (2006.01) |
| *H01L 27/32* | (2006.01) |
| *H01L 51/52* | (2006.01) |
| *G02F 1/1343* | (2006.01) |

(Continued)

(52) U.S. Cl.
CPC .......... *G06F 3/044* (2013.01); *G02F 1/13338* (2013.01); *G02F 1/13439* (2013.01); *G02F 1/133305* (2013.01); *G02F 1/133308* (2013.01); *G06F 3/0412* (2013.01); *G09F 9/00* (2013.01); *G09F 9/30* (2013.01); *H01L 27/323* (2013.01); *H01L 51/5237* (2013.01); *H01L 51/5253* (2013.01); *G02F 2001/133314* (2013.01); *G02F 2202/28* (2013.01); *G06F 2203/04105* (2013.01); *H01L 2251/5338* (2013.01)

(58) Field of Classification Search
CPC ........... G06F 3/044; G06F 2203/04105; G06F 3/0412; G09F 9/30; G09F 9/00; G02F 1/1343; G02F 1/1333; G02F 1/13439; G02F 1/133305; G02F 1/13338; H01L 51/5253; H01L 27/323; H01L 51/5237
See application file for complete search history.

(56) References Cited

U.S. PATENT DOCUMENTS

| | | | | |
|---|---|---|---|---|
| 8,342,271 B2 * | 1/2013 | Filippov | .................. | B25J 5/005 |
| | | | | 180/65.8 |
| 9,419,544 B2 * | 8/2016 | Kim | ...................... | H01L 41/113 |

(Continued)

FOREIGN PATENT DOCUMENTS

JP    2000-66837    3/2000

*Primary Examiner* — Benyam Ketema
(74) *Attorney, Agent, or Firm* — Oblon, McClelland, Maier & Neustadt, L.L.P.

(57) ABSTRACT

The display device includes: a cover glass including a screen that can be pressed; a liquid crystal panel arranged on a back side of the cover glass in a thickness direction (Z direction); a drive electrode arranged in a region corresponding to the screen in the liquid crystal panel; a base electrode arranged in the region corresponding to the screen at a position spaced apart from the drive electrode on the back side in the thickness direction; a cushion layer arranged between the liquid crystal panel and the base electrode; and a circuit that detects an electric signal representing the amount of change in capacitance between the drive electrode and the base electrode as a signal which enables calculation of a pressing force of the press. The cushion layer has such a characteristic that an elastic modulus decreases as approaching a periphery from a center in the region corresponding to the screen.

10 Claims, 24 Drawing Sheets

(51) Int. Cl.
*G09F 9/30* (2006.01)
*G09F 9/00* (2006.01)

(56) References Cited

U.S. PATENT DOCUMENTS

| | | | | |
|---|---|---|---|---|
| 10,088,936 | B2* | 10/2018 | Zellers | G06F 3/0414 |
| 10,510,627 | B2* | 12/2019 | Park | G02F 1/136286 |
| 2005/0273910 | A1* | 12/2005 | Cozens | A42B 3/12 2/411 |
| 2006/0103081 | A1* | 5/2006 | Dietrich | H05K 9/0015 174/356 |
| 2010/0156845 | A1* | 6/2010 | Kim | G06F 3/016 345/174 |
| 2014/0191973 | A1* | 7/2014 | Zellers | G06F 3/0414 345/168 |
| 2014/0210313 | A1* | 7/2014 | Kim | H02N 1/08 310/339 |
| 2015/0301669 | A1* | 10/2015 | Miyazaki | G06F 3/044 345/173 |
| 2016/0034078 | A1* | 2/2016 | Ryu | G06F 3/047 345/174 |
| 2016/0098109 | A1* | 4/2016 | Choi | G06F 3/044 345/174 |
| 2017/0262112 | A1* | 9/2017 | Noguchi | G02F 1/134336 |
| 2018/0018044 | A1* | 1/2018 | Hong | G06F 3/0414 |
| 2018/0039367 | A1* | 2/2018 | Suzuki | G06F 3/0412 |
| 2018/0081466 | A1* | 3/2018 | Moon | H01L 41/1132 |
| 2018/0136762 | A1* | 5/2018 | Jeong | G02F 1/133305 |
| 2018/0136767 | A1* | 5/2018 | Hamada | G06F 3/0412 |
| 2018/0224992 | A1* | 8/2018 | Hong | G06F 3/0414 |
| 2018/0307361 | A1* | 10/2018 | Park | G06F 3/0414 |
| 2018/0328799 | A1* | 11/2018 | Park | G06F 3/0416 |

* cited by examiner

*FIG. 6A*

| TF FRAME PERIOD | | | | | | | | | |
|---|---|---|---|---|---|---|---|---|---|
| TT TOUCH DETECTION PERIOD | | | | | TP PRESS DETECTION PERIOD | | | | |
| Td1 | Tt1 | .... | Tdm | Ttm | Td1 | Tf1 | .... | Tdn | Tfn |

Td1~Tdm: DISPLAY PERIOD  Td1~Tdn: DISPLAY PERIOD
Tt1~Ttm: TOUCH PERIOD    Tf1~Tfn: PRESS PERIOD

*FIG. 6B*

| TF FRAME PERIOD | | | | | | | | | |
|---|---|---|---|---|---|---|---|---|---|
| Td1 | Tt1 | Tf1 | Td2 | Tt2 | Tf2 | .... | Tdk | Ttk | Tfk |

Td1~Tdk: DISPLAY PERIOD
Tt1~Ttk: TOUCH PERIOD
Tf1~Tfk: PRESS PERIOD

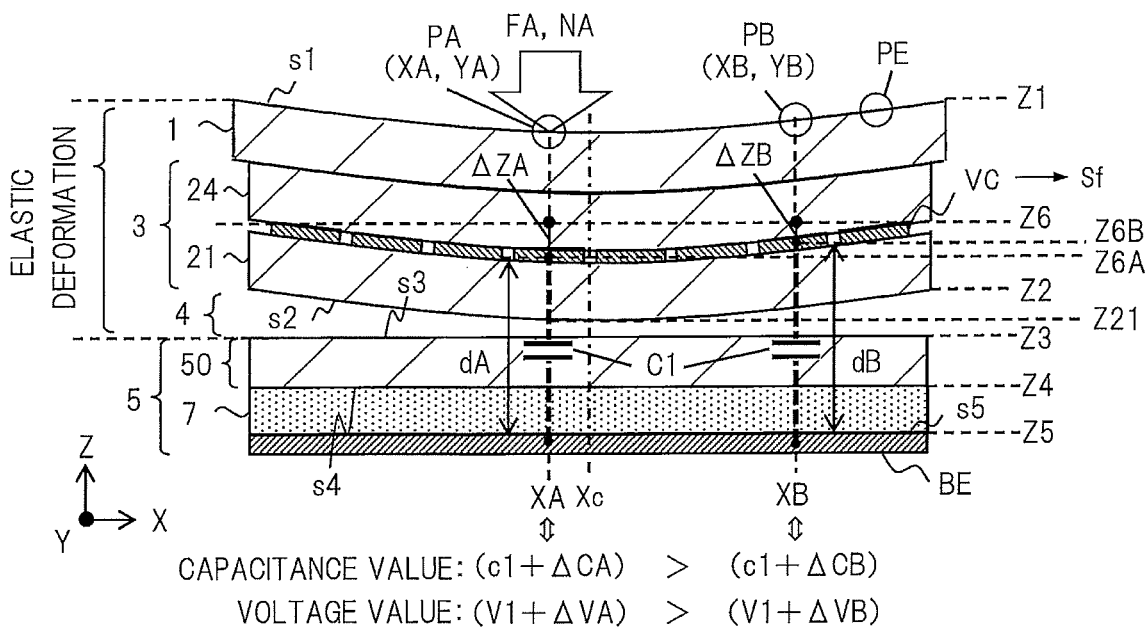
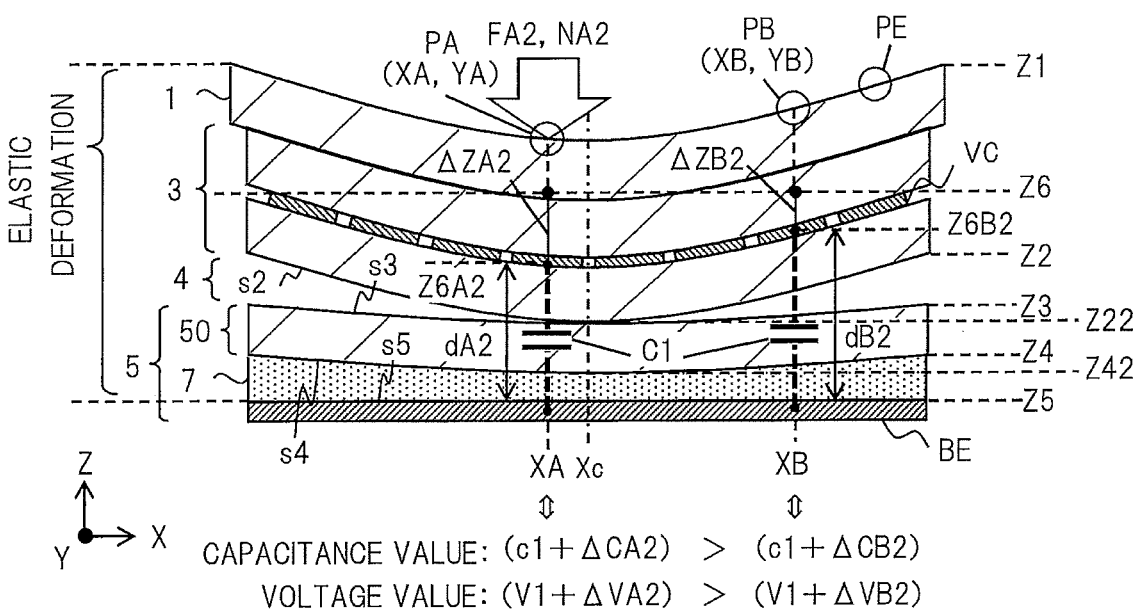

FIRST EMBODIMENT

FIRST MODIFICATION EXAMPLE

SECOND MODIFICATION EXAMPLE

THIRD MODIFICATION EXAMPLE

FOURTH MODIFICATION EXAMPLE

FIFTH MODIFICATION EXAMPLE

SIXTH MODIFICATION EXAMPLE

SEVENTH MODIFICATION EXAMPLE

EIGHTH MODIFICATION EXAMPLE

SECOND EMBODIMENT

THIRD EMBODIMENT

DISPLAY DEVICE

CROSS-REFERENCE TO RELATED APPLICATION

The present application claims priority from Japanese Patent Application No. 2016-241888 filed on Dec. 14, 2016, the content of which is hereby incorporated by reference into this application.

TECHNICAL FIELD OF THE INVENTION

The present invention relates to a technique for a display device, and relates to a display device having a press detection function.

BACKGROUND OF THE INVENTION

A liquid crystal touch panel module or the like, which is mounted on an electronic device such as a smartphone, has been known as a display device having a press detection function (hereinafter, referred to as a press sensor in some cases). This module has both a touch detection function and a press detection function. A method of utilizing a change in electrostatic capacitance between electrodes caused by press on a screen is adopted for the press sensor. When the screen is pressed by an object such as a finger, the display device provided with the press sensor detects an electric signal representing the amount of change in electrostatic capacitance associated with a pressing load and a pressing force. The display device calculates the pressing force or the like from the detected signal through a predetermined operation based on physics. Alternatively, the display device determines whether or not a value of the detected signal, the calculated pressing force, or the like is equal to or larger than a threshold value. The display device and the electronic device can perform predetermined control process by utilizing such press detection information.

The representative embodiment of the present invention is a display device, and is characterized by including the following configuration.

A display device according to an embodiment includes: a display panel that performs display on a screen; a plurality of plate-shaped drive electrodes that are arranged in a region corresponding to the screen in the display panel; a solid base electrode that is arranged in the region corresponding to the screen at a position spaced apart from the drive electrode of the display panel on a back side in a thickness direction; and an elastic layer that is arranged between the display panel and the base electrode in the thickness direction, and the elastic layer includes a central region in the region corresponding to the screen and a peripheral region of the central region, and an elastic modulus of the peripheral region is lower than an elastic modulus of the central region.

BRIEF DESCRIPTIONS OF THE DRAWINGS

FIG. 6A is a diagram showing a configuration of a frame period of time-division control in the first embodiment;

FIG. 6B is a diagram showing a configuration of a frame period of time-division control in the first embodiment;

FIG. 11 is a view showing a cross section of the module in a first deformation state in the first embodiment;

FIG. 12 is a view showing a cross section of the module in a second deformation state in the first embodiment;

DESCRIPTIONS OF THE PREFERRED EMBODIMENTS

Figure 1:
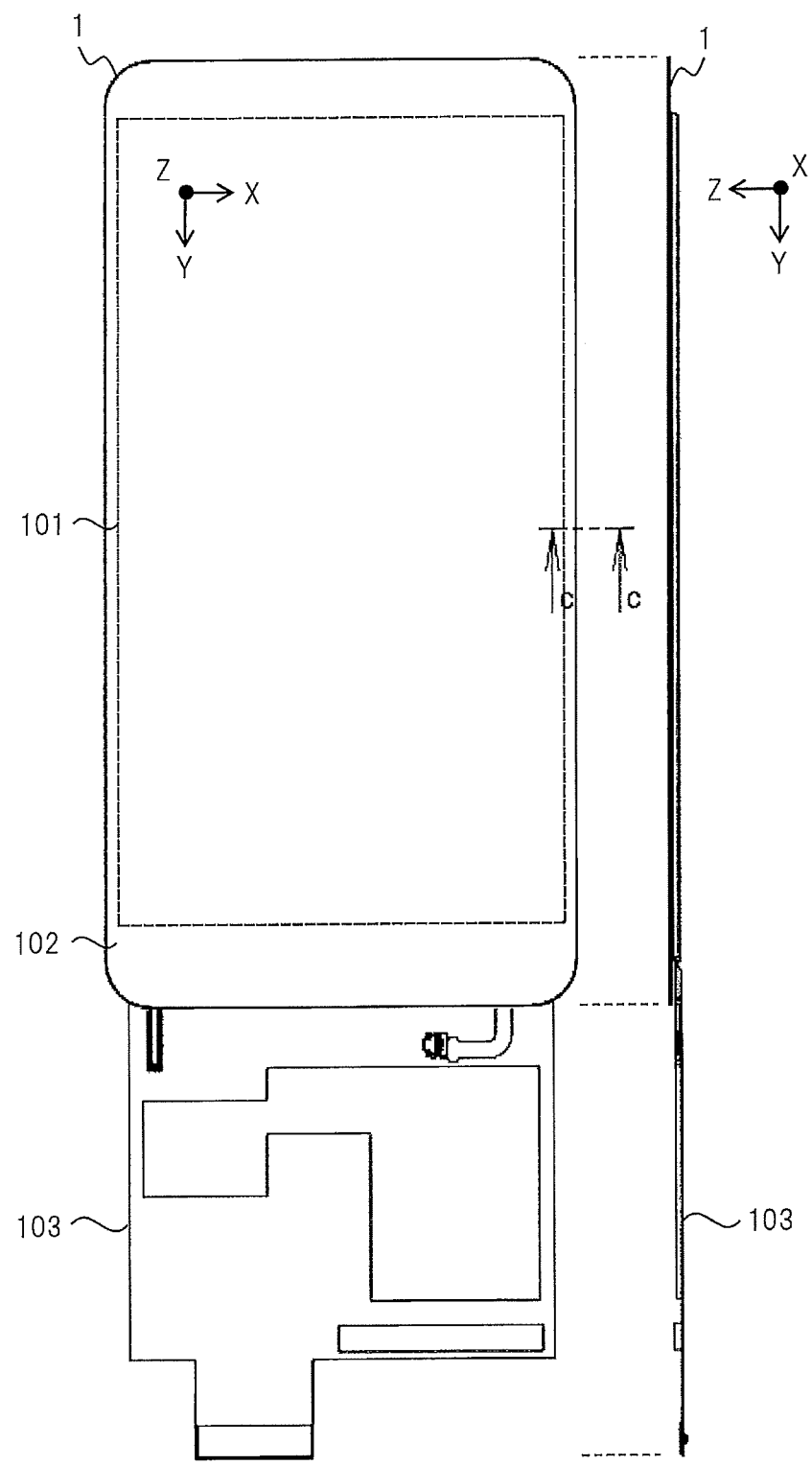
FIG. 1 is a view mainly showing a configuration of a front surface as a configuration of a display device according to a first embodiment of the present invention.

Hereinafter, embodiments of the present invention will be described in detail with reference to the drawings. Note that the disclosure is mere an example, and it is a matter of course that any alteration that is easily conceivable as appropriate by a person skilled in the art, while keeping a gist of the invention, is included in the scope of the present invention. In principle, the same elements as those already described are denoted by the same reference characters in the present specification and all the drawings, and a repetitive description will be omitted in some cases. In the drawings, a width, a thickness, a shape and the like of each portion are schematically illustrated in comparison to actual aspects in order to make the description more clearly understood, but these are mere examples and do not limit the interpretation of the present invention. In addition, when there are a plurality of the same elements, only some of the elements are denoted by reference characters in the drawings, or hatching of a cross section is omitted in some cases. Note that (X, Y, Z) are provided as directions and a coordinate system for the description. An X direction which is a first direction corresponds to the horizontal direction inside a screen, and a Y direction which is a second direction corresponds to the vertical direction inside the screen. A Z direction which is a third direction is a direction perpendicular to the X direction and the Y direction and corresponds to a thickness direction of a module.

First Embodiment

Figure 13:
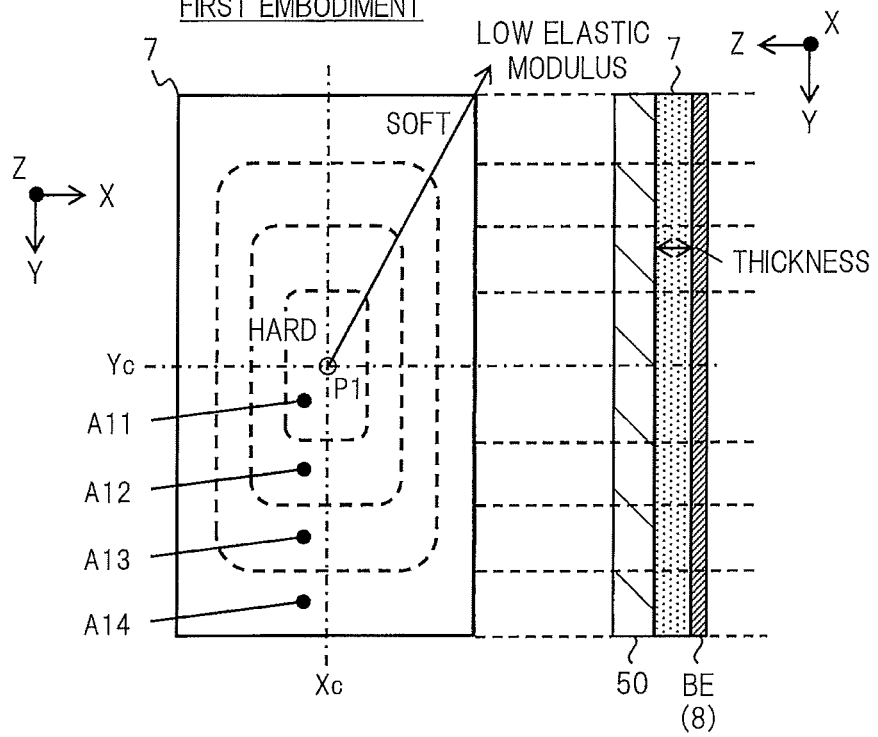
FIG. 13 is a view showing a configuration of a cushion layer in the first embodiment.

A display device according to a first embodiment of the present invention will be described with reference to FIGS. 1 to 30. The display device according to the first embodiment is particularly a liquid crystal touch panel module as a display device having a press detection function, and has a cushion layer 7 in the module as shown in FIG. 2. As shown in FIG. 13, a characteristic of the cushion layer 7 is designed such that an elastic modulus differs depending on a position inside a screen 101, and the elastic modulus thereof is high near the center of the screen 101 and the elastic modulus decreases as approaching a periphery. When pressing the screen 101, the elastic deformation of the module is received and buffered by the cushion layer 7. The amount of displacement of the module in the Z direction depending on the position inside the screen 101 is adjusted by the cushion layer 7. The cushion layer 7 performs the adjustment to make a signal have a favorable characteristic at the time of press detection. The characteristic represents a relationship between a pressing load and the displacement amount in the Z direction or the amount of change in electrostatic capacitance depending on the position inside the screen 101. A difference in a detection value depending on a difference in the position inside the screen 101 is alleviated by the cushion layer 7, and the characteristic is adjusted so as to become uniform inside the screen 101. Accordingly, in the display device, a correction operation in consideration of the characteristic can be easily performed by using a value of the adjusted detection signal at the time of the operation for the press detection. As a result, it is possible to perform the highly accurate detection of the pressing force. In addition, by providing the cushion layer 7, the thickness of the other parts can be reduced, so that it is possible to reduce the thickness of the module.

[Display Device]

Figure 2:
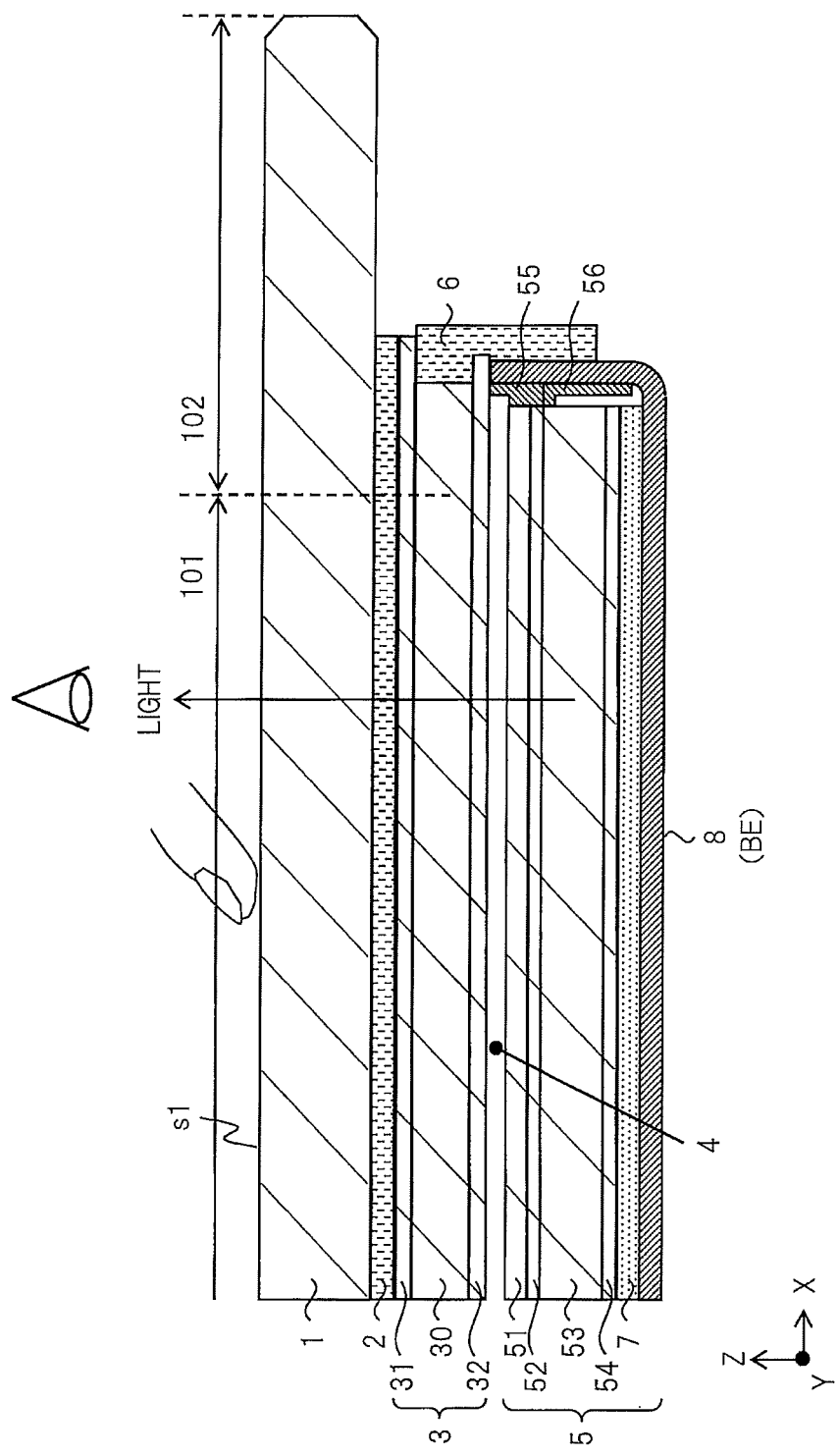
FIG. 2 is a view showing a cross-sectional configuration of a module on an XZ plane in the display device of the first embodiment.

FIG. 1 shows a configuration of a module of a display device viewed from the front as a configuration of the display device of the first embodiment. A cover glass 1 is provided on a front surface of the module, and the rectangular screen 101 is provided. The screen 101 is a range in which an image is displayed and is a range in which touch detection and press detection are possible. A frame portion 102 is provided in a region outside the screen 101. On a back side in the Z direction, a base electrode BE constituted of a metal plate of a backlight device (not shown) is provided in a rectangular region that covers the region of the screen 101. A flexible printed circuit board 103 is connected to a lower side of the module in the Y direction. A wiring, an IC, and the like are mounted on the flexible printed circuit board 103. The flexible printed circuit board 103 is folded so as to wrap around to the back side. The module of the display device is accommodated in a housing of an electronic device such as a smartphone which includes the display device as a component.

[Cross Section (1)]

FIG. 2 shows a cross section of the module of the display device on an XZ plane taken along a line C-C of FIG. 1 corresponding to the X direction. In the module, a region where the screen 101 is provided when viewed from a top in the Z direction is defined as a main body portion, and a region outside the main body portion is defined as the frame portion 102. The module roughly includes the cover glass 1, an adhesive layer 2, a liquid crystal panel 3, an air layer 4, and a backlight device 5 in the main body portion in this order from the top in the Z direction. In addition, the module includes a fixing portion 6 that connects the liquid crystal panel 3 and the backlight device 5 in the frame portion 102.

The fixing portion 6 is made of an adhesive material. The fixing portion 6 connects an end portion of the liquid crystal panel 3 and an end portion of the backlight device 5 in the Z direction at least at a part of four sides of the frame portion 102, thereby fixing positions of the liquid crystal panel 3 and the backlight device 5. Accordingly, the main body portion has a structure that can be deflected in the Z direction by press. The fixing portion 6 is not limited to the adhesive material and may be constituted of a rigid frame structure or the like.

The cover glass 1 is a protective layer which has predetermined rigidity, elasticity and light permeability and serves as the housing to protect the module, and includes a surface s1 which corresponds to the screen 101 and with which an object such as a finger is brought into contact. The screen 101 is a surface to be touched and pressed.

The adhesive layer 2 is a layer that fixes a lower surface of the cover glass 1 and an upper surface of the liquid crystal panel 3 (particularly, a polarizing plate 31) by adhesion, has predetermined optical characteristics, and is made of, for example, UV resin (ultraviolet curing resin).

Figure 9:
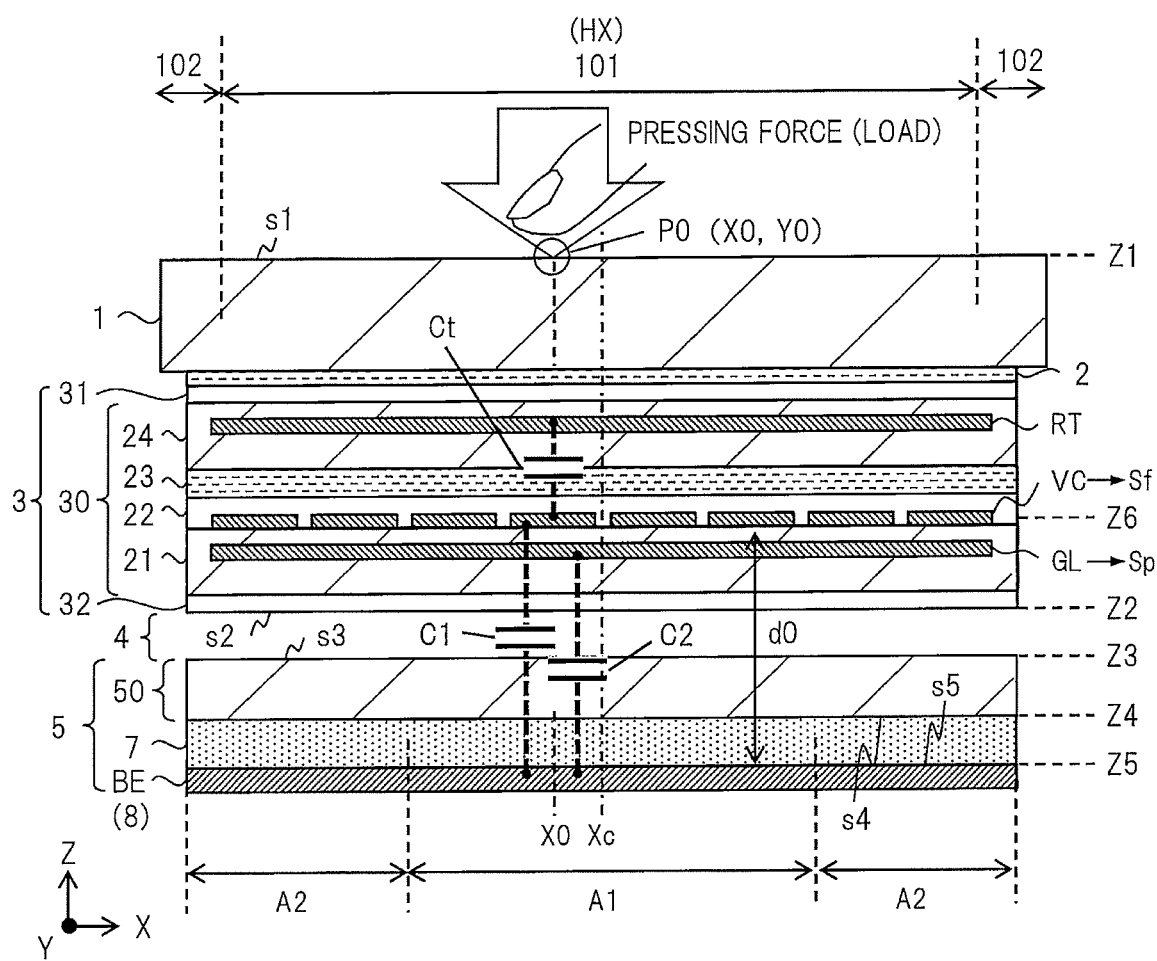
FIG. 9 is a view showing details of a cross section of the module on the XZ plane in the first embodiment.

The liquid crystal panel 3 includes the polarizing plate 31, a panel portion 30, and a polarizing plate 32. The polarizing plate 31 and the polarizing plate 32 are known components configured to implement liquid crystal display and have predetermined polarization characteristics. The panel portion 30 is constituted of an array substrate, a liquid crystal layer, a color filter substrate, and the like, which will be described later (FIG. 9). A drive electrode or the like for press detection is provided in the liquid crystal panel 3.

The air layer 4 is an air layer provided between a lower surface of the liquid crystal panel 3 (particularly, a lower surface of the polarizing plate 32) and an upper surface of a prism sheet 51 serving as an upper surface of the backlight device 5. Displacement caused by elastic deformation of the liquid crystal panel 3 and the like is received by the air layer 4.

The backlight device 5 includes the prism sheet 51, a diffusion sheet 52, a light guide plate 53, and a reflection sheet 54 in this order from the top in the Z direction as components of a light guide portion, inside a metal plate 8. In addition, the cushion layer 7 is provided between the metal plate 8 and the light guide portion (particularly, the reflection sheet 54) inside the backlight device 5.

The metal plate 8 is a structure having predetermined rigidity and conductivity and constituting a case that serves as a housing of the backlight device 5, and accommodates the light guide portion and the cushion layer 7. The metal plate 8 has a bottom surface portion arranged in a region of the XY plane including the screen 101 and a side surface portion bent from the bottom surface portion in the frame portion 102 so as to be erect in the Z direction. The bottom surface portion of the metal plate 8 is configured to function as the base electrode BE to be used for press detection. In other words, the base electrode BE is constituted of the metal plate 8. An upper end of the side surface portion of the metal plate 8 in the Z direction abuts on the polarizing plate 32. An outer surface of the side surface portion of the metal plate 8 is connected to the fixing portion 6. A frame 55 and a flexible printed circuit board 56 are connected to an inner surface of the side surface portion of the metal plate 8.

The base electrode BE is an electrode layer that forms a potential which serves as a reference at the time of press detection. The base electrode BE is provided as a solid layer extending over the XY plane that includes the screen 101 of the main body portion. The elastic deformation of the base electrode BE hardly occurs at the time of press, and a Z-direction position thereof is kept almost constant as a reference. As a modification example, a mode in which the base electrode BE (metal plate 8) is configured such that the Z-direction position is displaced by a certain extent of elastic deformation at the time of press is also possible. The elastic deformation of the base electrode BE is sufficiently smaller than elastic deformation of a portion of the liquid crystal panel 3. In that case, predetermined correction operation in consideration of the displacement caused by the elastic deformation of the base electrode BE may be performed to detect a pressing force at the time of operation of press detection in the IC.

In the backlight device 5, a light source (not shown) is arranged in the frame portion 102. Light from the light source is guided in the X direction and the Y direction by the light guide portion and is emitted to an upper side in the Z direction by reflection and scattering. The light emitted from the backlight device 5 passes through the liquid crystal panel 3 and the like and is emitted from the screen 101. The light guide plate 53 guides the light from the light source in the X direction and the Y direction. The reflection sheet 54 reflects the light to the upper side in the Z direction. The diffusion sheet 52 scatters the light from a lower side in the Z direction to the upper side in the Z direction. The prism sheet 51 condenses the light from the lower side in the Z direction to the upper side in the Z direction.

In the frame portion 102, end portions of the prism sheet 51 and the diffusion sheet 52 are connected to the frame 55, and the frame 55 is connected to the side surface portion of the metal plate 8. In addition, an end portion of the light guide plate 53 is connected to the flexible printed circuit board 56, and the flexible printed circuit board 56 is connected to the side surface portion of the metal plate 8.

When the screen 101 is pressed, the cover glass 1 and the liquid crystal panel 3 are deflected in the Z direction by the elastic deformation, and the lower surface of the liquid crystal panel 3 is brought into contact with the upper surface of the light guide portion of the backlight device 5 via the air layer 4. Further, when the press is great to a certain extent, the liquid crystal panel 3 and the light guide portion are integrally deflected in the Z direction by the elastic deformation. Note that the prism sheet 51, the diffusion sheet 52, and the light guide plate 53 constituting the light guide portion of the backlight device 5 have an elastic modulus lower than the cushion layer 7. Thus, it is possible to implement the detection with sufficiently high accuracy without considering the influence caused by elastic deformation of the light guide portion at the time of press detection.

The cushion layer 7 is an elastic layer made of an elastic sheet, in other words, a buffer layer. The cushion layer 7 is made of a material with an elastic modulus sufficiently higher than air. The cushion layer 7 implements a function of adjusting the amount of displacement when the screen 101 is pressed and the liquid crystal panel 3 and the light guide portion of the backlight device 5 are displaced in the Z direction by the elastic deformation. A characteristic of the cushion layer 7 is designed to have different elastic moduli depending on positions such as the center and the periphery in the region of the XY plane corresponding to the screen 101. Specifically, the cushion layer 7 has a relatively high elastic modulus near the center of the screen 101 so as to be hardly elastically deformed, and has a relatively low elastic modulus near the periphery close to the frame portion 102 so as to be easily elastically deformed. When the cover glass 1, the liquid crystal panel 3, the air layer 4, the light guide portion of the backlight device 5, and the like are elastically deformed at the time of press, the cushion layer 7 receives and buffers the elastic deformation. In the case of the mode where the cushion layer 7 is not provided, the light guide portion and the like have characteristics such as the displacement amount varying depending on the position inside the screen 101.

The cushion layer 7 adjusts the displacement amount of the liquid crystal panel 3, the light guide portion, and the like in the Z direction based on a characteristic of elastic modulus distribution inside the screen 101. The cushion layer 7 adjusts the displacement amount so as to be relatively small near the center of the screen 101 and relatively large near the periphery. Namely, the cushion layer 7 adjusts the characteristic depending on the position inside the screen 101 at the time of press so as to be as uniform as possible inside the screen 101. The characteristic is a characteristic that represents a relationship of the displacement amount in the Z direction or the amount of change in capacitance with respect to the pressing load depending on the position inside the screen 101. As a result of buffering by the cushion layer 7, the displacement amount and the capacitance change amount are adjusted so as to have predetermined distribution depending on the position inside the screen 101. In association with this, a detection value in the detection signal from the electrode is also adjusted so as to have predetermined distribution depending on the position inside the screen 101.

Accordingly, the IC of the display device performs operation of the pressing force or the like by using the detection signal based on the characteristics adjusted by the cushion layer 7 at the time of press detection. Thus, it is possible to calculate and obtain the pressing force with high accuracy in a state where the influence due to a difference in position inside the screen 101 is alleviated. In addition, the display device can detect the press by utilizing the detection signal in a favorable range adjusted by the cushion layer 7. Thus, the Z-direction length of the module can be suppressed to be short, which can contribute to reduction in thickness of the module.

[Exploded Perspective]

Figure 3:
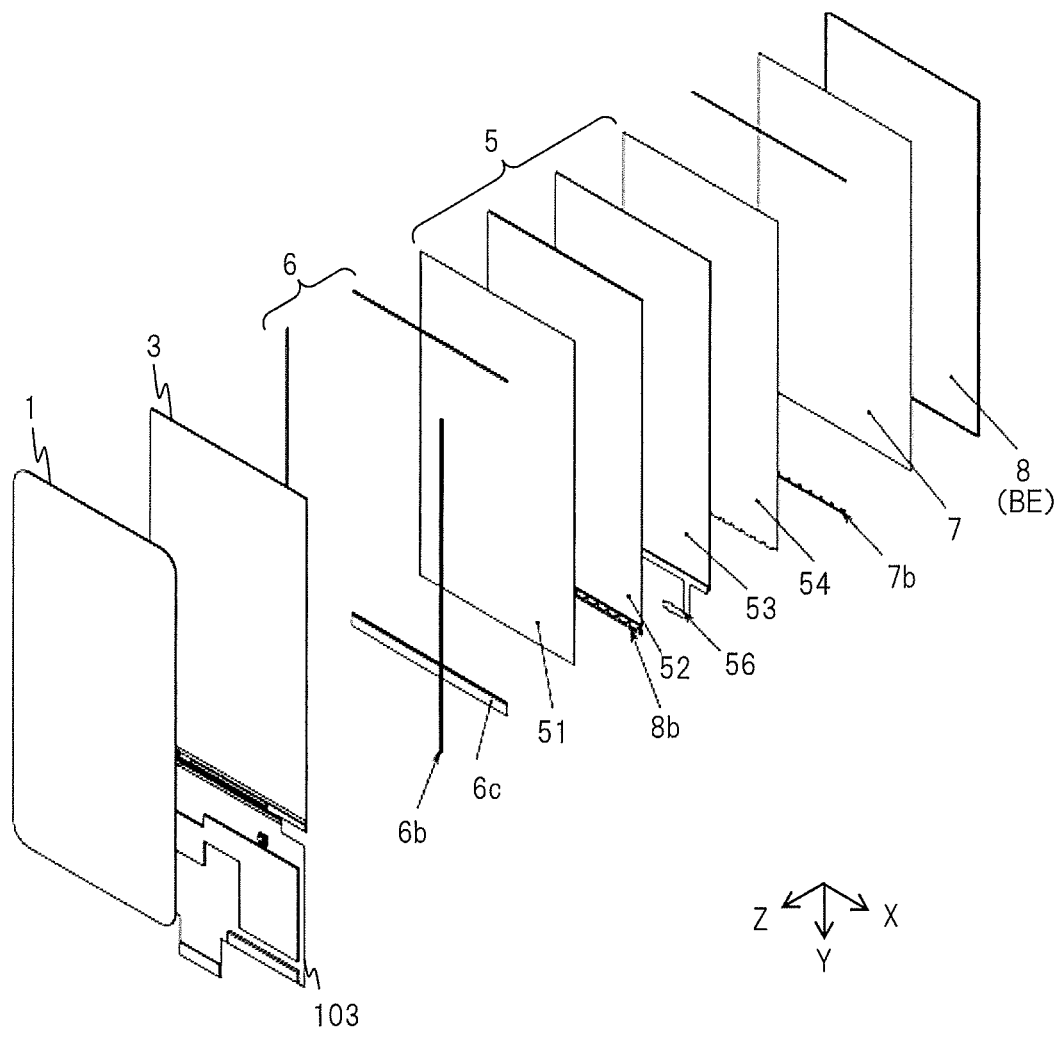
FIG. 3 is a perspective view showing an exploded configuration of the module in the first embodiment.

FIG. 3 is a perspective view showing components of the module of the display device in an exploded manner. Note that the adhesive layer 2 and the like are omitted in FIG. 3. As a supplement to the configuration of FIG. 2, the fixing portion 6 includes an adhesive 6b and a double-sided tape 6c. The double-sided tape 6c is arranged on a lower side of the module. The lower surface of the liquid crystal panel 3 and an upper surface of the prism sheet 51 are connected by the double-sided tape 6c. The frame 55 is connected to a lower side of the diffusion sheet 52. The flexible printed circuit board 56 is connected to a lower side of the light guide plate 53. In addition, spacers 7b are arranged on upper and lower sides of the cushion layer 7. The spacers 7b fix the end portions of the cushion layer 7 between the metal plate 8 and the reflection sheet 54 to ensure a predetermined thickness of the cushion layer 7 in the Z direction.

[Circuit and Electrode]

Figure 4:
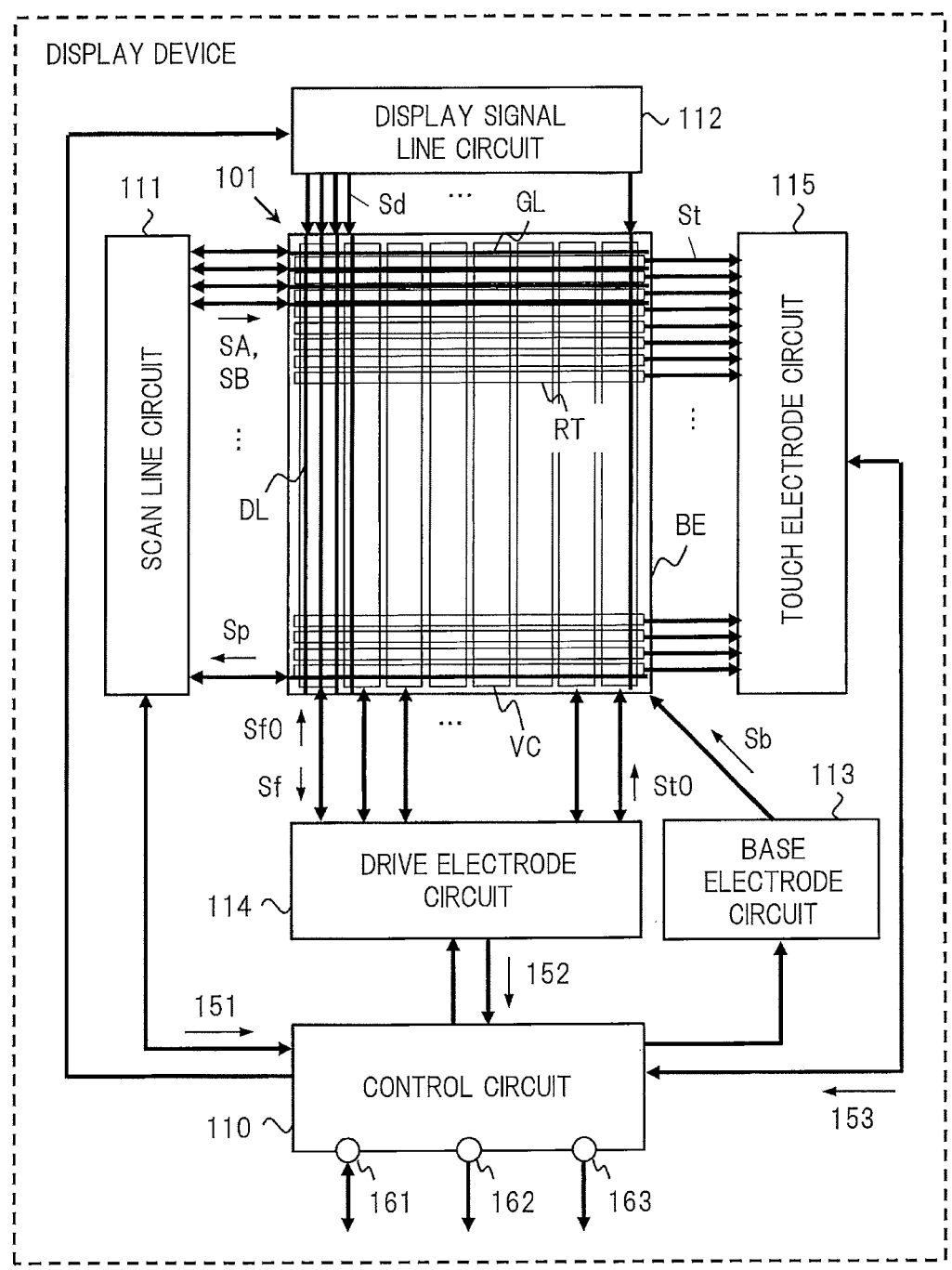
FIG. 4 is a diagram showing a configuration of electrodes and circuits in the first embodiment.

FIG. 4 shows a functional block configuration of circuits and the like of the display device. FIG. 4 mainly shows electrodes, circuits, and the like relating to display, touch detection, and press detection. As the electrodes and signal lines in the region corresponding to the screen 101, the display device includes scan lines GL, display signal lines DL, the base electrode BE, drive electrodes VC, touch electrodes RT, and the like. As the circuits, the display device includes a control circuit 110, a scan line circuit 111, a display signal line circuit 112, a base electrode circuit 113, a drive electrode circuit 114, a touch electrode circuit 115, and the like. The respective circuits, connection lines that connect the electrode and the circuit, and the like are mounted on, for example, the flexible printed circuit board 103 or the like provided with an IC chip.

The control circuit 110 controls the entire display device and the respective circuits, and transmits a clock signal, a control signal, a data signal, and the like to the respective circuits. The control circuit 110 receives a control signal, a detection signal, and the like from the respective circuits, and calculates a pressing force, a touch position coordinate, and the like by using the detection signal and the like.

The scan line circuit 111 performs drive and detection with respect to the plurality of scan lines GL of the screen 101. The scan line circuit 111 includes a drive detection circuit for the drive and detection of the scan lines GL. The scan line circuit 111 performs two kinds of scans including a scan for image display and a scan for pressing position detection in a time-division manner (FIG. 6) based on the clock signal and the control signal. The scan line circuit 111 sequentially scans the plurality of scan lines GL, for example. The scan line circuit 111 supplies a display scan signal SA to the scan line GL during a display period. The display scan signal SA is a signal for selection of a pixel. During a press detection period, the scan line circuit 111 supplies a press scan signal SB to the scan line GL and detects a response signal thereto as a signal Sp from the scan line GL. The press scan signal SB is a signal for detection of the pressing position on the screen 101. The signal Sp is an electric signal that represents the amount of change in electrostatic capacitance (capacitance C2 in FIG. 9) between the scan line GL and the base electrode BE. The scan line circuit 111 outputs a detection signal 151 based on the signal Sp to the control circuit 110.

The display signal line circuit 112 performs display drive with respect to the plurality of display signal lines DL of the screen 101. The display signal line circuit 112 supplies a display signal Sd to the display signal line DL during the display period. The display signal Sd is a signal for controlling a luminance value of pixel display.

The base electrode circuit 113 drives the base electrode BE. The base electrode circuit 113 supplies a signal Sb to the base electrode BE. The signal Sb is an electric signal for setting the base electrode BE to a constant potential. The base electrode circuit 113 supplies the signal Sb to the base electrode BE during the press detection period.

The drive electrode circuit 114 performs drive and detection for pressing force detection and touch detection with respect to the plurality of drive electrodes VC of the screen 101. The drive electrode circuit 114 includes a drive detection circuit for the drive and detection with respect to the drive electrodes VC. During the press detection period, the drive electrode circuit 114 supplies a signal Sf0 for pressing force detection to the drive electrode VC, and detects a response signal to the signal Sf0 as a signal Sf. The signal Sf0 is a signal for calculating and detecting the presence or absence of press and the pressing force on the screen 101. The signal Sf is an electric signal that represents the amount of change in electrostatic capacitance (capacitance C1 in FIG. 9) between the base electrode BE and the drive electrode VC. The drive electrode circuit 114 outputs a detection signal 152 based on the signal Sf.

During a touch detection period, the drive electrode circuit 114 supplies a signal St0 for touch drive to the drive electrode VC. The signal St0 is a signal for the touch detection on the screen 101, that is, a signal for calculating the presence or absence of touch, the touch position coordinate, and the like. A response signal to the signal St0 is output from a touch electrode RT through coupling of capacitance (capacitance Ct in FIG. 9) between the drive electrode VC and the touch electrode RT.

The touch electrode circuit 115 performs detection with respect to the plurality of touch electrodes RT of the screen 101. The touch electrode circuit 115 includes a detection circuit for the detection with respect to the touch electrodes RT. During the touch detection period, the touch electrode circuit 115 detects a signal St output from the touch electrode RT. The signal St is an electric signal that represents the amount of change in electrostatic capacitance (capacitance Ct in FIG. 9) between the drive electrode VC and the touch electrode RT in accordance with a state such as a proximity or contact (generally referred to as a touch state) of an object such as a finger to the screen 101.

In the first embodiment, the control circuit 110 performs operation process of the pressing force, the touch position coordinate, and the like based on the detection signals from the respective circuits. The control circuit 110 calculates the pressing position coordinate by using the detection signal 151 from the scan line circuit 111 and calculates the pressing force by using the detection signal 152 from the drive electrode circuit 114. The control circuit 110 performs predetermined correction operation at the time of calculating the pressing force. The control circuit 110 calculates the touch position coordinate by using the detection signal 153 from the touch electrode circuit 115.

The control circuit 110 can perform control process by using information such as the obtained pressing force and touch position coordinate. An example of the control process is a process to control an operation such as touch, tap, and swipe with respect to an object of a graphical user interface of the screen 101. For example, it is possible to execute different processes in accordance with a magnitude of the pressing force to an object such as an icon. For example, it is possible to make such an association that a touch state is set when the pressing force to the object is lower than a first level, a sub menu is displayed when the pressing force is the first level or higher and lower than a second level, and the object is executed when the pressing force is the second level or higher and lower than a third level.

The control circuit 110 can output information such as the obtained pressing force to the respective units in the display device, and further can output the obtained information to the outside through a terminal. The control circuit 110 includes a control terminal 161, a touch detection terminal 162, a press detection terminal 163, and the like. The control circuit 110 receives an input of control information or the like from the outside and outputs control information or the like to the outside through the control terminal 161. The control circuit 110 can output touch detection information including the touch position coordinate and the like to the outside through the touch detection terminal 162. The control circuit 110 can output press detection information including the pressing force and the like to the outside through the press detection terminal 163.

As a modification example, the drive electrode circuit 114 may calculate the pressing force and the like and output the detection information including the pressing force to the control circuit 110. In addition, the scan line circuit 111 may calculate the pressing position coordinate and the like and output the detection information including the pressing position coordinate to the control circuit 110. Further, the touch electrode circuit 115 may calculate the touch position coordinate and the like and output the detection information including the touch position coordinate and the like to the control circuit 110. As another modification example, a detection signal from the drive electrode circuit 114 or the like may be transmitted from the control circuit 110 to an external device via a terminal and a communication interface device, and the external device may calculate the pressing force and the like by using the detection signal.

In the display device according to the first embodiment, in particular, it is possible to detect both the position of a pressing point and the pressing force on the screen 101 and to detect a plurality of pressing points on the screen 101 at the same time, as a press detection method based on the above-described configuration of electrodes and circuits. Note that the configuration of electrodes and circuits for press detection and touch detection is not limited to the above-described configuration, and various configurations are possible.

[Circuit and Electrode—Configuration Example]

Figure 5:
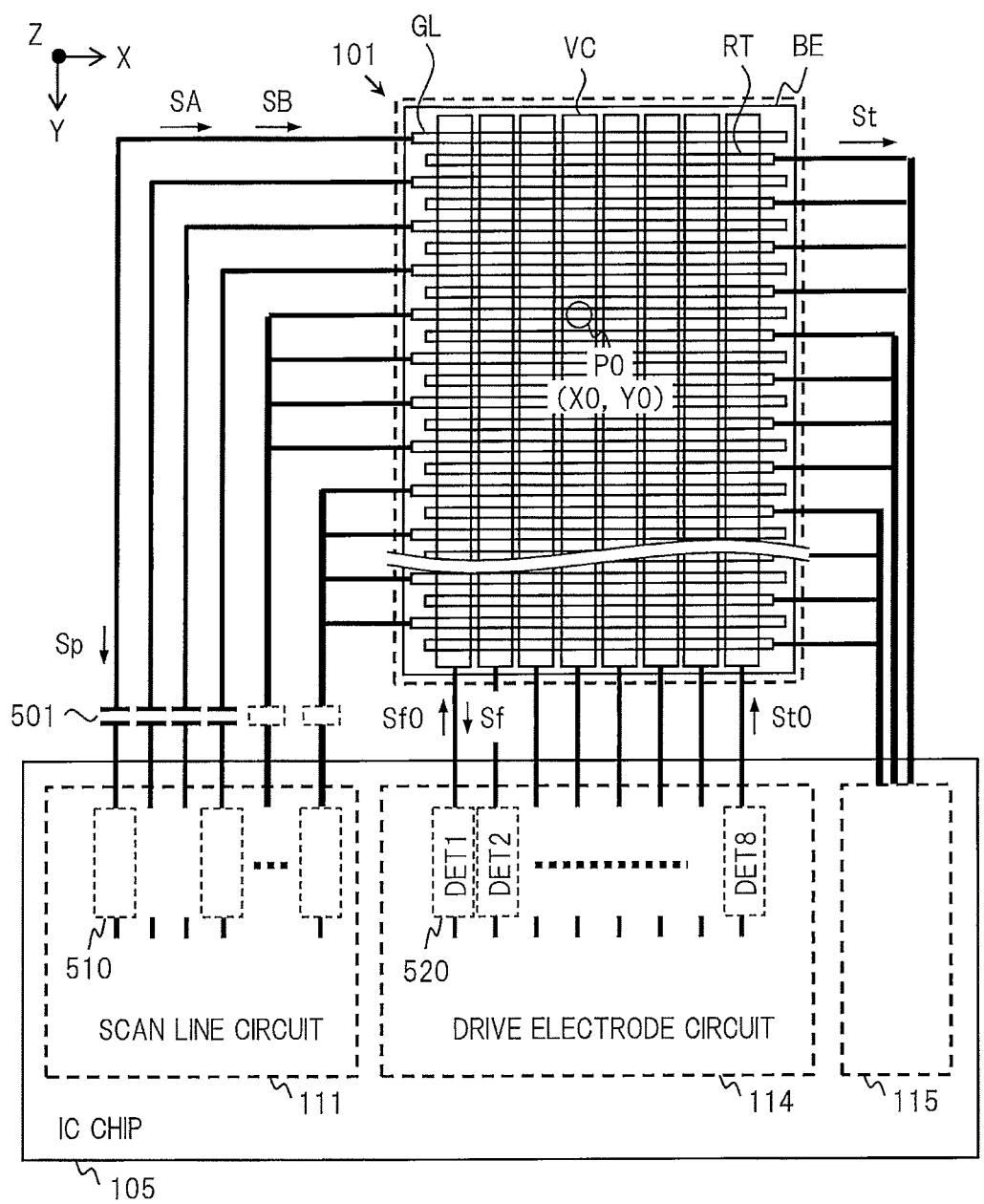
FIG. 5 is a diagram showing a configuration example of the electrodes and the circuits in the first embodiment.

FIG. 5 shows a configuration example of the scan line GL, the drive electrode VC and the touch electrode RT and a configuration example of circuits connected to these electrodes on the XY plane of the screen 101. FIG. 5 shows a case where the scan line circuit 111, the drive electrode circuit 114, the touch electrode circuit 115, and the like are mounted on one IC chip 105. A processor of the IC chip 105 performs the operation of press detection and the like. A point P0 represents an example of the pressing point to be touched and pressed, and a position coordinate thereof inside the screen 101 is defined as (X0, Y0).

The plurality of scan lines GL extend in the X direction in parallel to each other in the region of the screen 101. End portions of the scan lines GL are connected to the scan line circuit 111 through connection lines and capacitive elements 501. The plurality of touch electrodes RT extend in the X direction in parallel to each other between the plurality of scan lines GL. End portions of the plurality of touch electrodes RT are connected to the touch electrode circuit 115 through connection lines.

The plurality of drive electrodes VC extend in the Y direction in parallel to each other in the region of the screen 101. The drive electrode VC is a plate-shaped electrode that has a predetermined width in the X direction and is long in the Y direction. The drive electrodes VC adjacent to each other in the X direction are arranged with a short slit interposed therebetween. In the present embodiment, eight drive electrodes VC are arranged in the X direction, but the actual number of the drive electrodes VC is not limited thereto.

The scan line circuit 111 supplies the display scan signal SA or the press scan signal SB to the scan line GL in a time-division period. The signal Sp output from the scan line GL with respect to the press scan signal SB is input to the detection circuit 510 inside the scan line circuit 111 via the capacitive element 501. The detection circuit 510 detects a voltage value from the signal Sp. A value of the signal Sp from the scan line GL corresponding to the pressing point is different from values of the signals Sp from the other scan lines GL. Thus, a position coordinate in the Y direction regarding the pressing point can be detected by using the plurality of signals Sp. In addition, a value of the signal Sf from the drive electrode VC corresponding to the pressing point is different from values of the signals Sf from the other drive electrodes VC. Thus, a position coordinate in the X direction regarding the pressing point can be detected by using the plurality of signals Sf.

In this configuration, the scan line GL is shared by the display scanning and the press scanning. Thus, the capacitive element 501 is inserted in the connection line that connects the scan line GL and the scan line circuit 111. When the scan line GL is used for detecting the pressing position during the press detection period, a voltage different from a voltage of the display scan signal SA is used as the voltage of the press scan signal SB. A voltage signal to turn on a gate terminal of a switch element (FIG. 7) of a pixel to be selected is used for the display scan signal SA. On the other hand, a voltage signal which prevents the gate terminal of the switch element of the pixel from being turned on is used for the press scan signal SB. The presence of the capacitive element 501 makes it possible to apply a negative voltage to the scan line GL as the press scan signal SB with respect to a positive voltage of the display scan signal SA. Thus, the display state of the pixel is not affected at the time of press detection.

In addition, the drive electrode VC is shared by driving for press detection and driving for touch detection in this configuration. The press detection and the touch detection are controlled in a time-division manner. The signal Sf0 is supplied to the drive electrode VC during the press detection period, and the signal St0 is supplied to the drive electrode VC during the touch detection period. Although the signal Sf0 and the signal St0 are not particularly limited, for example, an AC signal having a predetermined frequency is used.

A detection circuit 520 of the drive electrode circuit 114 is configured as an analog front-end circuit. For example, one detection circuit 520 is connected to one drive electrode VC. The detection circuit 520 is constituted of an integration circuit, a capacitive element, a switch element, and the like. A reference voltage, a drive voltage, and the like are input to a positive input terminal of the integration circuit. A negative input terminal of the integration circuit is connected to the drive electrode VC through a connection line. An output terminal of the integration circuit is fed back to the negative input terminal through the capacitive element. The positive input terminal and the negative input terminal of the integration circuit are configured to be virtually short-circuited. The capacitive element and the switch element are connected between the negative input terminal and the output terminal of the integration circuit. The capacitive element constitutes a feedback capacitor. An operation of the detection circuit 520 is controlled by turning on or off the switch element. The negative input terminal and the output terminal of the integration circuit are short-circuited in an ON state of the switch element.

The signal St0 based on the drive voltage is supplied from the negative input terminal of the integration circuit to the drive electrode VC through the virtual short circuit at the time of touch drive. The signal Sf0 based on the drive voltage is supplied from the negative input terminal of the integration circuit to the drive electrode VC through the virtual short circuit at the time of press drive. At the time of press detection, the current of the signal Sf from the drive electrode VC is held in the capacitive element in an OFF state of the switch element. In an ON state of the switch element, the integration circuit integrates the current and converts the integrated current into a voltage, and outputs the voltage signal thereof as a detection signal from the output terminal.

[Time-Division Control]

FIGS. 6A and 6B show configuration examples of a frame period relating to time-division control. FIG. 6A shows a first configuration example. A frame period TF roughly includes a touch detection period TT and a press detection period TP as time-division periods. The touch detection period TT further includes a plurality of display periods Td1 to Tdm and a plurality of touch periods Tt1 to Ttm, and the display period and the touch period are alternately arranged in a time-division manner. Similarly, the press detection period TP further includes a plurality of display periods Td1 to Tdn and a plurality of press periods Tf1 to Tfn, and the display period and the press period are alternately arranged in a time-division manner. An image of one frame is displayed by using the display scan signal SA and the display signal Sd during the plurality of display periods Td1 to Tdm. The touch detection is performed by using the signal St0 and the signal St during the touch period. The press detection is performed by using the press scan signal SB, the signal Sf0, and the signal Sf during the press period.

FIG. 6B shows a second configuration example. The frame period TF includes display periods Td1 to Tdk, touch periods Tt1 to Ttk, and press periods Tf1 to Tfk, and the display period, the touch period, and the press period are alternately arranged in this order. The configuration of the time-division control is not limited to the above-described configuration example, and other configurations are also possible.

[Pixel]

Figure 7:
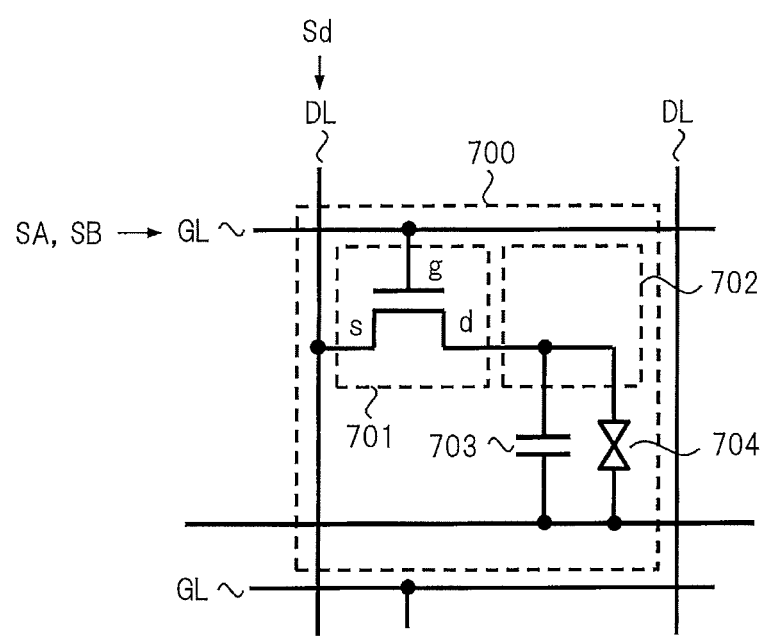
FIG. 7 is a diagram showing a configuration of a pixel in the first embodiment.

FIG. 7 shows a configuration of an equivalent circuit of a pixel 700 of the screen 101. The pixel 700 is provided so as to correspond to a region where the scan line GL and the display signal line DL cross each other on the XY plane. The plurality of pixels 700 are arranged in a matrix on the screen 101. The pixel 700 corresponds to, for example, sub-pixels divided into three colors of red, green, and blue. Each of the pixels 700 includes a switch element 701 and a pixel electrode 702. There is no limitation on a shape and the like of the pixel electrode 702.

The switch element 701 is an element that is configured of a thin film transistor (TFT) element or the like so as to control a state of the pixel 700. The scan line GL is connected to a gate terminal of the switch element 701, the display signal line DL is connected to a source terminal thereof, and the pixel electrode 702 is connected to a drain terminal thereof. A capacitive element 703 and a liquid crystal element 704 are connected to the pixel electrode 702. The capacitive element 703 and the liquid crystal element 704 are connected to a common electrode (not shown). The capacitive element 703 constitutes a retention capacitor relating to liquid crystal display. The liquid crystal element 704 is configured of the liquid crystal layer of the liquid crystal panel 3.

The display scan signal SA and the press scan signal SB are supplied from the scan line GL to the gate terminal of the switch element 701. The display signal Sd is supplied from the display signal line DL to the source terminal of the switch element 701. The switch element 701 selected by the display scan signal SA is turned into an ON state. A voltage based on the display signal Sd is applied to the pixel electrode 702 in the switch element 701. The voltage of the display signal Sd is a voltage for controlling the transmittance of the liquid crystal element 704 in accordance with a gradation value.

[Screen Pressing Position]

Figure 8:
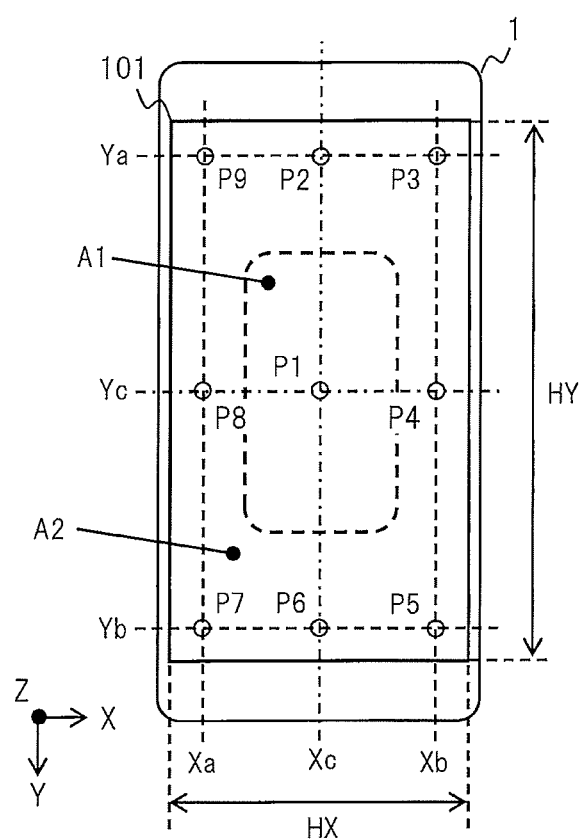
FIG. 8 is a view showing a pressing position of a screen in the first embodiment.

FIG. 8 shows a position of a pressing point on the screen 101. A width of the screen 101 in the X direction is denoted as HX, and a width in the Y direction is denoted as HY. The width HY is larger than the width HX. A middle position of the screen 101 in the X direction is denoted as Xc, and a middle position in the Y direction is denoted as Yc. Points P1 to P9 are shown as examples of the pressing point. The point P1 indicates a center point of the screen 101 in the X direction and the Y direction, and a position coordinate thereof is (Xc, Yc). The point P2 indicates a middle point near an upper side of the screen 101, and a position coordinate thereof is (Xc, Ya). The point P3 indicates a point near an upper right corner of the screen 101, and a position coordinate thereof is (Xb, Ya). The point P4 indicates a middle point near a right side of the screen 101, and a position coordinate thereof is (Xb, Yc). Similarly, the point P5 (Xb, Yb) near a lower right corner, the point P6 (Xc, Yb) which is a middle point near a lower side, the point P7 (Xa, Yb) near a lower left corner, the point P8 (Xa, Yc) which is a middle point near a left side, and the point P9 (Xa, Ya) near an upper left corner are shown.

[Cross Section (2)]

FIG. 9 shows a cross section of the module of the display device on the XZ plane. FIG. 9 particularly shows a cross-sectional configuration of the liquid crystal panel 3, capacitances relating to detection, and the like. FIG. 9 particularly shows a reference state where no pressing force is applied. The panel portion 30 of the liquid crystal panel 3 roughly includes an array substrate 21, an electrode layer 22, a liquid crystal layer 23, and a color filter substrate 24 in this order from the bottom in the Z direction. In the array substrate 21, the scan line GL, the display signal line DL, the above-described switch element 701, and the like are formed on a substrate made of glass or resin. The drive electrode VC, the pixel electrode, and the like are formed in the electrode layer 22. Since the pixel electrode and the like are well-known elements, illustrations thereof will be omitted. Liquid crystal molecules are sealed between alignment films in the liquid crystal layer 23. In the color filter substrate 24, a color filter, a light shielding film, and the like are formed on a substrate made of glass, resin, or the like. In addition, in this configuration, the touch electrode RT is formed on a side close to the polarizing plate 31 in the Z direction in the color filter substrate 24.

The drive electrode VC and the touch electrode RT are required to transmit light for display, and thus are made of a light-transmissive conductive member. These electrodes can be made of, for example, indium tin oxide (ITO), indium zinc oxide (IZO), or the like. A size of the drive electrode VC, for example, a width thereof in the X direction is larger than that of the scan line GL, the pixel, or the like. The resolution of a press detection position may be higher than the resolution of the pixel of the screen 101.

A lower surface of the polarizing plate 32 of the liquid crystal panel 3 is defined as a surface s2. An upper surface of a light guide portion 50 (particularly, the prism sheet 51) is defined as a surface s3. The air layer 4 is formed between the surface s2 and the surface s3. In FIG. 9, the prism sheet 51, the diffusion sheet 52, the light guide plate 53, and the reflection sheet 54 of the backlight device 5 are collectively shown as the light guide portion 50. A lower surface of the light guide portion 50 (particularly, the reflection sheet 54) is defined as a surface s4. An upper surface of the base electrode BE is defined as a surface s5. The cushion layer 7 is provided between the surface s4 and the surface s5.

In FIG. 9, a capacitance between the base electrode BE and the drive electrode VC is shown as the capacitance C1. A capacitance between the base electrode BE and the scan line GL is shown as a capacitance C2. A capacitance between the touch electrode RT and the drive electrode VC is shown as the capacitance Ct. The capacitance C1 is a capacitance relating to the detection of the pressing force. The capacitance C2 is a capacitance relating to the detection of the pressing position. The capacitance Ct is a capacitance relating to the detection of the touch. An electric signal representing an electrostatic capacitance change of each capacitance is detected by the above-described circuit.

An example of the pressing point of the screen 101 is indicated by the point P0, and a position coordinate thereof is (X0, Y0). In this embodiment, the position X0 of the pressing point is a position that is close to a position Xc in the middle of the screen 101 in the X direction. At the time of press, electrostatic capacitance values of the capacitance C1 and the capacitance C2 change at respective positions in a region where the pressing force is applied around the point P0. Accordingly, the amount of current of the signal Sf from each of the drive electrodes VC and the amount of current of the signal Sp from each of the scan lines GL change. The detection circuit 520 of the drive electrode circuit 114 detects the current corresponding to the electrostatic capacitance change amount of the capacitance C1 as a voltage value, and sets the detected voltage value as a detection signal. The detection circuit 510 in the scan line circuit 111 detects the current corresponding to the electrostatic capacitance change amount of the capacitance C2 as a voltage value, and sets the detected voltage value as a detection signal. The scan line circuit 111 of the IC chip 105 obtains a pressing position coordinate (X0, Y0) corresponding to the point P0 serving as the pressing point and a pressing force or a load at the pressing point based on the detection signals by predetermined operation. The pressing force is a force per unit area.

In FIG. 9, the cushion layer 7 roughly includes a region A1 and a region A2 in a region of the screen 101 with the width HX in the X direction. The cushion layer 7 has the elastic modulus that varies depending on the position in the X direction and the Y direction, and has such a characteristic that the elastic modulus continuously varies as approaching the periphery of the frame portion 102 from the point P1 at the center of FIG. 8. In FIG. 9 and the like, two kinds of regions having different elastic moduli are roughly shown as the regions A1 and A2 for ease of understanding. The region A1 is a region having a relatively high elastic modulus as a central region which is a first region. The region A2 is a region having a relatively low elastic modulus as a peripheral region which is a second region. Details of the elastic modulus design will be described later.

The elastic modulus is a physical property value representing a difficulty of deformation, is a generic term of a proportionality constant between stress and strain in elastic deformation, and is also referred to as an elastic coefficient or the like. With respect to the pressing force on the screen 101, a case where a deflection hardly occurs or a case where displacement in the Z direction is small corresponds to high elastic modulus, and a case where a deflection easily occurs or a case where displacement in the Z direction is large corresponds to low elastic modulus.

[Cross Section (3)]

Figure 10:
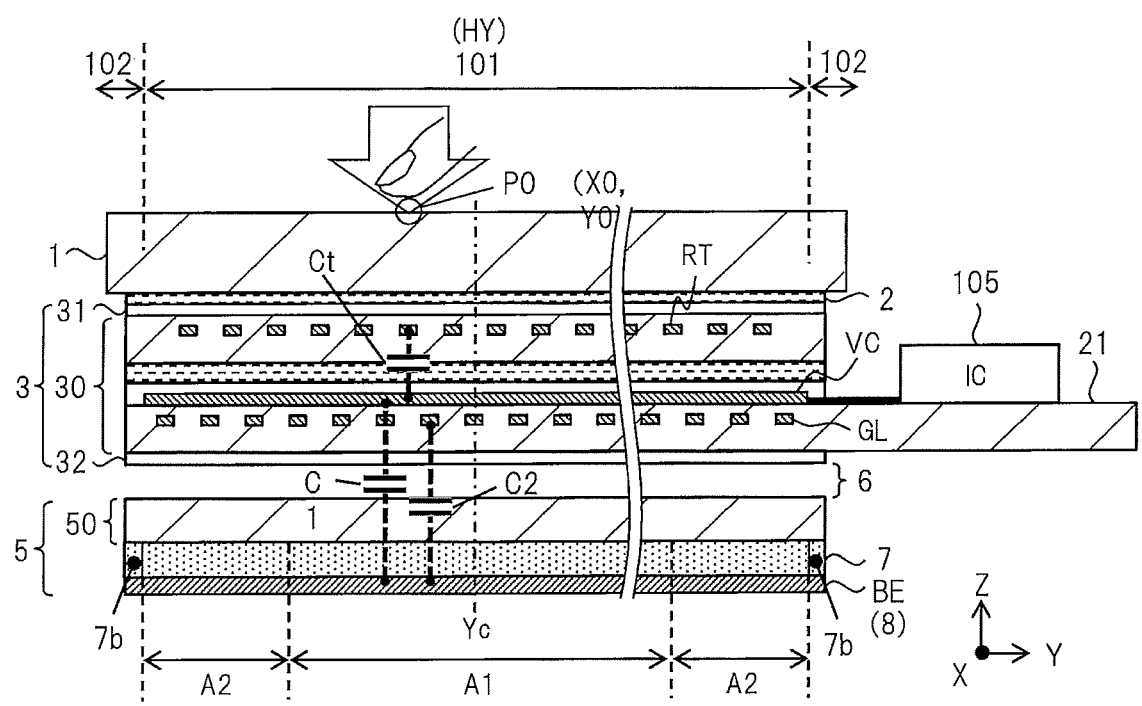
FIG. 10 is a view showing details of a cross section of the module on a YZ plane in the first embodiment.

Similarly, FIG. 10 shows a cross section of the module of the display device on the YZ plane. In a configuration of FIG. 10, in particular, the array substrate 21 extending outward from the lower side of the screen 101 in the Y direction is provided, and the IC chip 105 is mounted on the array substrate 21. For example, the drive electrode VC is physically and electrically connected to the IC chip 105 through a connection line. The IC chip 105 may be mounted on the flexible printed circuit board 103. There is no particular limitation on the mounting configuration of the circuit, the substrate, and the like. In the frame portion 102, the spacer 7b is arranged at each end portion of the cushion layer 7 between the light guide portion 50 and the metal plate 8.

[Elastic Deformation]

The elastic deformation of the module caused by press will be described. First, FIGS. 9 and 10 described above show the reference state where no pressing force is applied. A capacitance value of the capacitance C1 and a capacitance value of the capacitance C2 in this reference state are defined as c1 and c2, respectively. A distance d0 in the Z direction between the base electrode BE and each of the drive electrodes VC is uniform in the entire region of the screen 101. As the positions in the Z direction in the reference state of FIG. 9, positions of the surfaces s1, s2, s3, s4, and s5 are defined as Z1 to Z5. A position of the drive electrode VC is defined as Z6. A position of the base electrode BE is represented by the same position Z5 as the surface s5.

FIGS. 11 and 12 each schematically show a cross section on the XZ plane in a state where a deflection occurs by the elastic deformation by applying the pressing force from the reference state shown in FIG. 9. FIG. 11 shows a first deformation state, and FIG. 12 shows a second deformation state. For ease of description, the module structure relating to press detection is shown in a simplified manner in FIGS. 11 and 12. The cover glass 1, the color filter substrate 24, the electrode layer of the drive electrode VC, the array substrate 21, the air layer 4, the light guide portion 50 of the backlight device 5, the cushion layer 7, and the base electrode BE of the metal plate 8 are shown in this order from the top in the Z direction.

FIG. 11 shows a case where a point PA is set as an example of the point P0 which is the pressing point in the surface s1 of the cover glass 1 on the screen 101. The point PA is a point close to the middle position Xc of the screen 101 in the X direction, and a position coordinate thereof is (XA, YA). The point PA is included in the region A1. A pressing load by a finger is applied to the point PA. In the first deformation state, a pressing force and a load at the point PA are defined as FA and NA, respectively. The cover glass 1, the liquid crystal panel 3 and the like are elastically deformed by the pressing force FA at the point PA, and a deflection occurs in the Z direction. In particular, a downward displacement amount $\Delta Z$ in the Z direction is relatively large near the point PA and the position Xc, and the displacement amount $\Delta Z$ is relatively small at the position spaced apart from the center. The drive electrode VC positioned directly below the pressing point comes closest to the base electrode BE in the Z direction, and a distance between the electrodes becomes small, so that the corresponding capacitance value increases.

A point PB and a point PE are shown as examples of the position spaced apart from the center of the screen 101. A position coordinate of the point PB is defined as (XB, YB). The point PB is included in the region A2. The point PE is defined as a point adjacent to the frame portion 102 (point corresponding to the outermost drive electrode VC). As the pressing point approaches a position in the periphery close to the frame portion 102 (for example, any one of the points P2 to P9 in FIG. 8) apart from the center position Xc like the point PB or the point PE, characteristics vary.

The end portion of the module is fixed by the fixing portion 6 in the frame portion 102 as described above, and thus is hardly displaced. A displacement amount of the drive electrode VC at the point PA is defined as $\Delta ZA$ and a displacement amount of the drive electrode VC at the point PB is defined as $\Delta ZB$. The surface s2 which is the lower surface of the liquid crystal panel 3 is displaced from an original position Z2 to a position Z21 at the maximum. The drive electrode VC directly below the point PA is displaced from an original position Z6 to a position Z6A. The displacement amount $\Delta ZA$ is represented by a difference (Z6A−Z6). The drive electrode VC directly below the point PB is displaced from the original position Z6 to a position Z6B. The displacement amount $\Delta ZB$ is represented by a difference (Z6B−Z6). $\Delta ZA > \Delta ZB$ holds. A distance between the drive electrode VC and the base electrode BE at the point PA is defined as dA and a distance between the drive electrode VC and the base electrode BE at the point PB is defined as dB. dA<dB holds.

In the first deformation state, the elastic deformation terminates without exceeding the liquid crystal panel 3 and the air layer 4, and the elastic deformation hardly occurs in the backlight device 5 and the cushion layer 7. The surface s2 which is the lower surface of the liquid crystal panel 3 is not in contact with the surface s3 which is the upper surface of the backlight device 5 (Z21>Z3).

In association with the displacement amount and the distance described above, capacitance values of the respective capacitances vary depending on positions inside the screen 101. When the amount of change in capacitance from the reference state to the first deformation state is defined as $\Delta CA$, the capacitance value of the capacitance C1 relating to the point PA is represented by $(c1+\Delta CA)$ in the first deformation state. Similarly, for example, the capacitance value of the capacitance C1 relating to the point PB is represented by $(c1+\Delta CB)$. Voltage values associated with the respective capacitance values are represented by $(V1+\Delta VA)$ and $(V1+\Delta VB)$ when a voltage value in the reference state is defined as V1 and each amount of change in voltage is defined as $\Delta VA$ and $\Delta VB$. Since the displacement amount $\Delta Z$ is larger and the distance between the electrodes is shorter at the point PA near the center than at the point PB spaced apart from the center, the capacitance value of the capacitance C1 and the change amount thereof become relatively larger ($\Delta CA > \Delta CB$). Accordingly, the voltage value and the change amount thereof are relatively larger at the point PA than at the point PB ($\Delta VA > \Delta VB$).

FIG. 12 shows the second deformation state where the elastic deformation has further progressed from the first deformation state of FIG. 11. A pressing force at the point PA which is the pressing point is defined as FA2 and a load is defined as NA2. In the second deformation state, the surface s2 which is the lower surface of the liquid crystal panel 3 is in contact with the surface s3 which is the upper surface of the backlight device 5, and the light guide portion 50 and the cushion layer 7 are also elastically deformed. Due to this elastic deformation, the light guide portion 50 and the cushion layer 7 are also deflected and displaced in the Z direction. At the point PA, the surface s2 of the liquid crystal panel 3 is displaced from the original position Z2 to a position Z22. The surface s3 of the light guide portion 50 is displaced from an original position Z3 to the lower position Z22. The surface s4 of the cushion layer 7 is displaced from an original position Z4 to a lower position Z42.

In the second deformation state, the elastic deformation of parts such as the liquid crystal panel 3 above the air layer 4 is affected by a characteristic of the elastic modulus distribution of the cushion layer 7, and a degree of the elastic deformation, that is, the displacement amount $\Delta Z$ is alleviated as compared with a mode in which the cushion layer 7 is not provided. In the region A1, the elastic modulus of the cushion layer 7 is high and the cushion layer 7 is relatively hardly deformed, and the deformation of the liquid crystal panel 3 and the like is alleviated to a relatively large extent. In the region A2, the elastic modulus of the cushion layer 7 is low and the cushion layer 7 is relatively easily deformed, and the deformation of the liquid crystal panel 3 and the like is alleviated to a relatively small extent. The characteristic of the elastic deformation of the module approximates to be uniform within the screen 101 by the cushion layer 7.

A position Z6A2 of the drive electrode VC, a displacement amount $\Delta ZA2$, and a distance dA2 at the point PA are shown in the same manner. $\Delta ZA2 > \Delta ZA$ and $dA2 < dA$ hold. A position Z6B2 of the drive electrode VC, a displacement amount $\Delta ZB2$, and a distance dB2 at the point PB are shown in the same manner. $\Delta ZB2 > \Delta ZB$ and $dB2 < dB$ hold. When the amount of change from the reference state relating to the capacitance C1 is defined as $\Delta CA2$ and $\Delta CB2$, a capacitance value at the point PA is represented by $(c1+\Delta CA2)$, and a capacitance value at the point PB is represented by $(c1+\Delta CB2)$. Voltage values corresponding to the capacitance values are represented by $(V1+\Delta VA2)$ and $(V1+\Delta VB2)$.

At the time of press detection, the base electrode BE is set to a constant potential, and the current caused by the above-described signal flows in the drive electrode VC and the scan line GL. In this state, displacement in the Z direction caused by elastic deformation exists in a part to which a pressing force is applied, and thus, values of the capacitance C1 and the capacitance C2 change. In particular, the displacement amount $\Delta Z$ is larger, the inter-electrode distance is smaller, and the capacitance change amount $\Delta C$ is larger at a position closer to the center of the screen 101. Current values of output signals (the signal Sf and the signal Sp) from the respective electrodes change in association with the change of the values of the capacitance C1 and the capacitance C2. The current value is detected as the voltage value in the circuit described above. For example, the detection circuit 520 of the drive electrode circuit 114 detects the above-described capacitance change amount $\Delta C$ as a voltage change amount $\Delta V$ based on the signal Sf from the drive electrode VC. For example, the capacitance change amount $\Delta CA2$ relating to the point PA can be detected as a voltage change amount $\Delta VA2$. Similarly, the voltage change amount $\Delta V$ corresponding to the capacitance C1 at each position of the screen 101 can be detected. The control circuit 110 can calculate the pressing force (F: Force) at the pressing position by predetermined operation based on the characteristics of the module by using the voltage change amount $\Delta V$. Further, the control circuit 110 can calculate the position coordinate (X0, Y0) of the point P0 at the pressing position by predetermined operation by using the voltage change amount relating to the capacitance C2 in the signal Sp from the scan line GL.

When an object such as a finger is separated from the surface s1 of the screen 101 and the pressing load disappears from the first deformation state and the second deformation state, the module returns to the reference state shown in FIG. 9 by its own elastic restoring force.

When the screen 101 is pressed as in the first deformation state of FIG. 11 or the second deformation state of FIG. 12, the displacement amount $\Delta Z$ differs depending on a difference in pressing position inside the screen 101 even if the same load and pressing force are applied. Thus, the capacitance change amount $\Delta C$ and the voltage change amount $\Delta V$ corresponding thereto vary depending on the pressing position. Namely, a characteristic (in other words, sensitivity) of press detection varies depending on the pressing position of the screen 101. This characteristic roughly corresponds to the distribution in which the displacement amount in the Z direction decreases and the capacitance change amount $\Delta C$ decreases as approaching the periphery from the center of the screen. Accordingly, the control circuit 110 of the IC of the display device detects the pressing force with high accuracy by performing predetermined correction operation on the value of the detection signal in accordance with the above-described characteristic.

[Calculation of Pressing Force]

The following is supplements for the principle relating to the detection and calculation of the pressing force. In FIG. 11, for example, a state where the point PA on the screen 101 is touched by a finger and a pressing load at the point PA is zero is defined as an initial state. In the initial state, a capacitance value of the signal Sf output from the drive electrode VC is defined as c0. A state is changed from the initial state to a pressing state where the point PA is pressed. In the pressing state, a pressing force is defined as F and a load is defined as N. In addition, in the pressing state, a capacitance value of the signal Sf is defined as cf. In the initial state, the capacitance value c0 includes various capacitance values. In the pressing state, the capacitance value cf includes various capacitance values. A capacitance value of a capacitance Cm of the entire module is defined as cm. A capacitance value of the capacitance C1 in the initial state is defined as c1. A capacitance value of the capacitance Ct depending on a touch state is defined as ct. A capacitance value of the capacitance C1 in the pressing state is defined as c2. The capacitance change amount relating to the capacitance C1 in the change from the initial state to the pressing state is defined as $\Delta Cf$. The pressing force F and the like can be calculated based on a difference between the capacitance value c0 in the initial state and the capacitance value cf in the pressing state. The following relational expression is established.

$$c0 = cm + c1 + ct$$

$$cf = cm + c2 + ct = cm + (c1 + \Delta Cf) + ct$$

$$F \propto (cf - c0) = \Delta Cf$$

Namely, the pressing force F and the like can be calculated basically as a force proportional to the capacitance change amount $\Delta Cf$. The control circuit 110 can calculate the pressing force F and the load N corresponding thereto based on the above relational expression. The proportion relating to the pressing force F is not necessarily linear but can be obtained by a predetermined characteristic curve in accordance with the characteristics of the module as will be described later.

[Cushion Layer (1)]

Next, the module structure including the design of the elastic modulus distribution of the cushion layer 7 will be described. Various methods are available relating to the design of the elastic modulus distribution of the cushion layer 7, and some structural examples including modification examples will be described below.

FIG. 13 shows an outline of the characteristics of the elastic modulus distribution on the XY plane corresponding to the region of the screen 101 regarding the configuration of the cushion layer 7 according to the first embodiment. In addition, the right side of FIG. 13 shows a cross section on the YZ plane relating to the light guide portion 50, the cushion layer 7 and the base electrode BE. In the first embodiment, the following method is adopted for constituting the characteristics of the cushion layer 7. Namely, the characteristics of a material constituting the cushion layer 7 are changed such that the elastic modulus continuously changes as approaching the periphery from the center in the region of the screen 101.

In the configuration of FIG. 13, regions A11 to A14 are shown as a plurality of regions having different elastic moduli in the Z direction in the entire region of the cushion layer 7. The center point P1 of the screen 101 has the highest elastic modulus. The elastic modulus is relatively high in the region A11 including the point P1. Namely, the region A11 is hard and elastic deformation hardly occurs in the region A11. The elastic modulus continuously decreases as approaching the periphery close to the frame portion 102 from the center. The elastic modulus is relatively low in the peripheral region A14. Namely, the region A14 is soft and elastic deformation easily occurs in the region A14. In the configuration of FIG. 13, regions of the elastic modulus distribution inside the screen 101 are designed to be substantially rectangular. A thickness of the material in the Z direction is uniform inside the screen 101.

Figure 14:
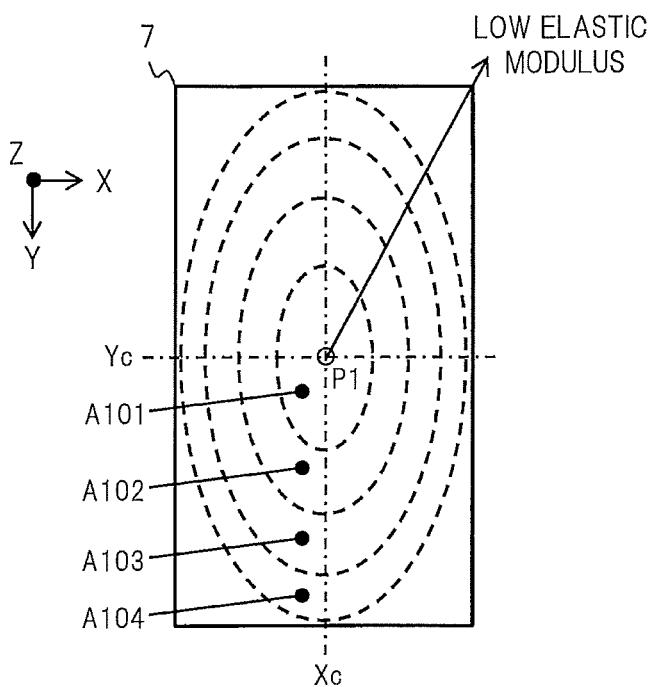
FIG. 14 is a view showing a configuration of a cushion layer in a first modification example of the first embodiment.

FIG. 14 shows a first modification example relating to the configuration of the cushion layer 7 in FIG. 13. In a configuration of FIG. 14, regions {A101 to A104} of elastic modulus distribution inside the screen 101 are designed to be substantially elliptical as a difference from the configuration of FIG. 13. The same effects can be obtained even in this configuration.

[Cushion Layer (2)]

Figure 15:
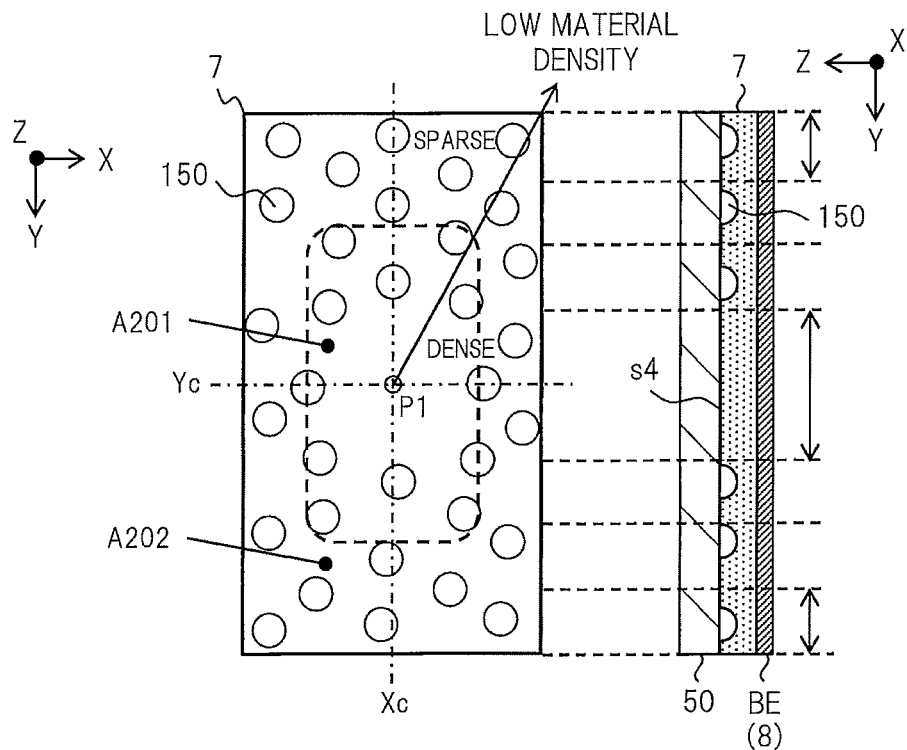
FIG. 15 is a view showing a configuration of a cushion layer in a second modification example of the first embodiment.

FIG. 15 shows a second modification example relating to the configuration of the cushion layer 7. In the second modification example, a method of changing the elastic modulus by a change in material density in the region of the screen 101 is adopted as the method for constituting the characteristics of the cushion layer 7. The elastic modulus may continuously change or may change in a plurality of stages of two or more stages. In the second modification example, the change in material density is achieved particularly by a change in density of holes or bubbles formed in a surface of the cushion layer 7. A constituent material of the cushion layer 7 is uniform inside the screen 101. A hole 150 shown as a circle is a hemispherical hole that is formed in the surface s4 which is the upper surface of the cushion layer 7 as shown in a cross-sectional view on the right side, and is configured as a region that does not penetrate through the lower surface of the cushion layer 7. Note that the configuration of the hole 150 is not limited thereto, and a hole or a groove that penetrates through the lower surface may be used.

Regions A201 and A202 are shown as regions having different elastic moduli. The holes 150 are formed such that the material density decreases as approaching the periphery from the center point P1. Namely, the arrangement density of the holes 150 increases as approaching the periphery from the center point P1. In the region A201, the number of the holes 150 is relatively small, so that the material density is high and the elastic modulus is high. In the region A202, the number of the holes 150 is relatively large, so that the material density is low and the elastic modulus is low.

In a manufacturing process of the module including the cushion layer 7, the holes 150 can be formed by various methods such as a method of mixing bubbles into a material, a method of digging the holes 150 in a flat upper surface of the material, and a method of forming the holes 150 by pressing protrusions to the flat upper surface of the material.

Figure 16:
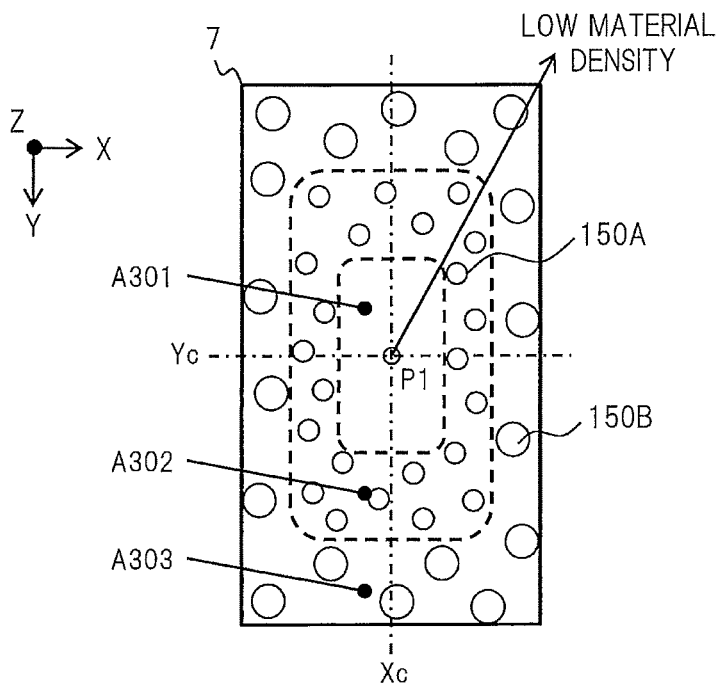
FIG. 16 is a view showing a configuration of a cushion layer in a third modification example of the first embodiment.

FIG. 16 shows a third modification example of the configuration of the cushion layer 7 as another mode relating to the second modification example. The method of changing the material density by forming the holes 150 is similarly adopted as a method of the third modification example. Regions A301, A302, and A303 are shown as regions having different elastic moduli. The holes 150 are formed such that the material density decreases as approaching the periphery from the center point P1. No hole is formed in the region A301 near the center. Holes 150A having first diameter and volume are formed in the region A302 outside the region A301. Further, holes 150B having larger second diameter and volume are formed in the region A303 in an outer periphery outside the region A302. Accordingly, the material density is high and the elastic modulus is high in the region A301. In the region A303, the material density is low and the elastic modulus is low. Intermediate characteristics between the region A301 and the region A303 are obtained in the region A302.

Figure 17:
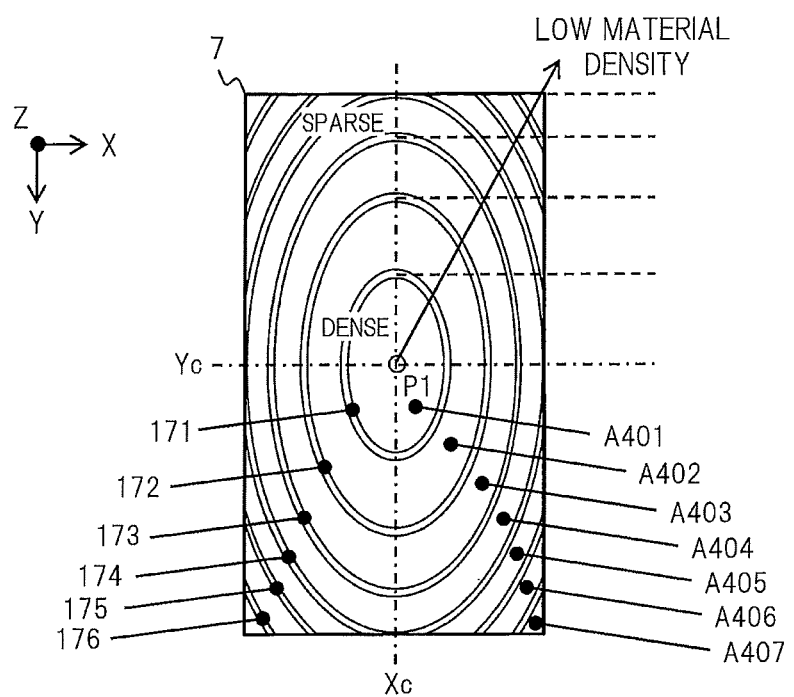
FIG. 17 is a view showing a configuration of a cushion layer in a fourth modification example of the first embodiment.

FIG. 17 shows a fourth modification example relating to the configuration of the cushion layer 7. The method of changing the material density is similarly adopted as a method of the fourth modification example, but a plurality of grooves with a concentric oval ring shape are formed in the method of the fourth modification example. Regions A401 to A407 are shown as regions having different elastic moduli. Grooves 171 to 176 are formed such that the material density decreases as approaching the periphery from the center point P1. An arrangement interval of the grooves becomes narrower as approaching the periphery from the center of the screen 101. Accordingly, the material density and the elastic modulus are higher in the region closer to the center of the screen 101, and the material density and the elastic modulus are lower in the region closer to the periphery. In another mode of the fourth modification example, the shape of the grooves may be substantially rectangular, or width of the grooves may be increased as approaching the periphery from the center of the screen 101.

[Cushion Layer (3)]

Figure 18:
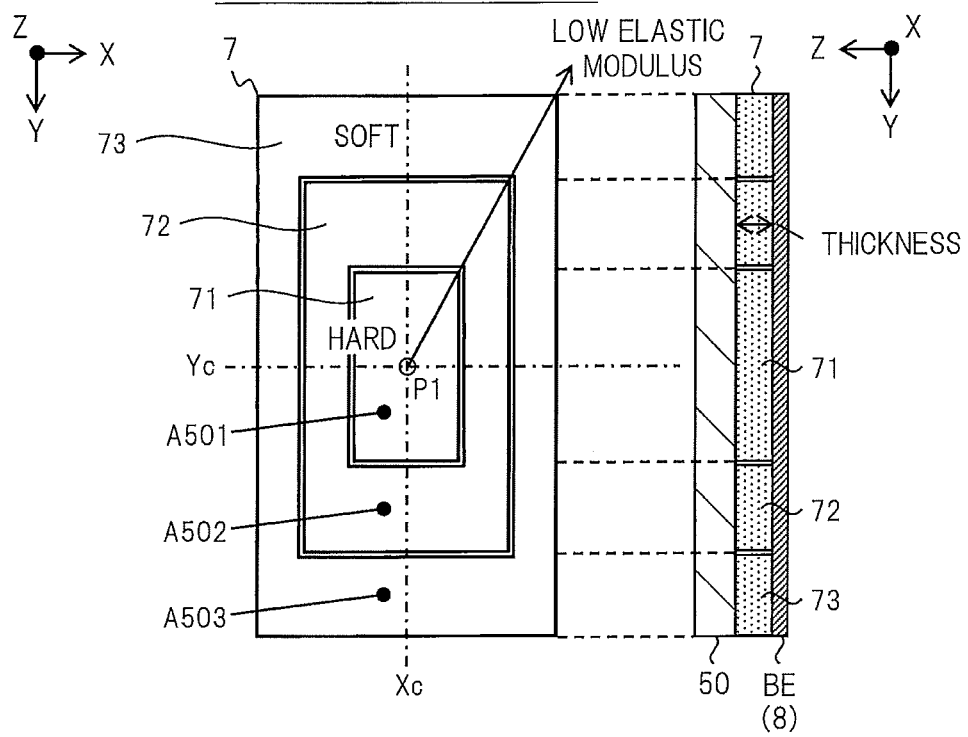
FIG. 18 is a view showing a configuration of a cushion layer in a fifth modification example of the first embodiment.

FIG. 18 shows a fifth modification example relating to the cushion layer 7. In the fifth modification example, a method of changing the elastic modulus by arrangement of a plurality of kinds of members in the region of the screen 101 is adopted as the method for constituting the characteristic of the cushion layer 7. A plurality of members made of a plurality of kinds of materials having different elastic moduli are used as a constituent material of the cushion layer 7. In the screen 101, a member having a different elastic modulus is arranged for each of the regions intended to have different elastic moduli. A thickness of each member in the Z direction is the same inside the screen 101, and the elastic moduli thereof are different.

The cushion layer 7 is configured of members 71 to 73. The member 71 has a first elastic modulus which is the highest and is arranged in a rectangular region A501 at the center. The member 72 has a second elastic modulus and is arranged in a frame-shaped region A502 in the middle. The member 73 has a third elastic modulus which is the lowest and is arranged in a frame-shaped region A503 in the periphery.

Figure 19:
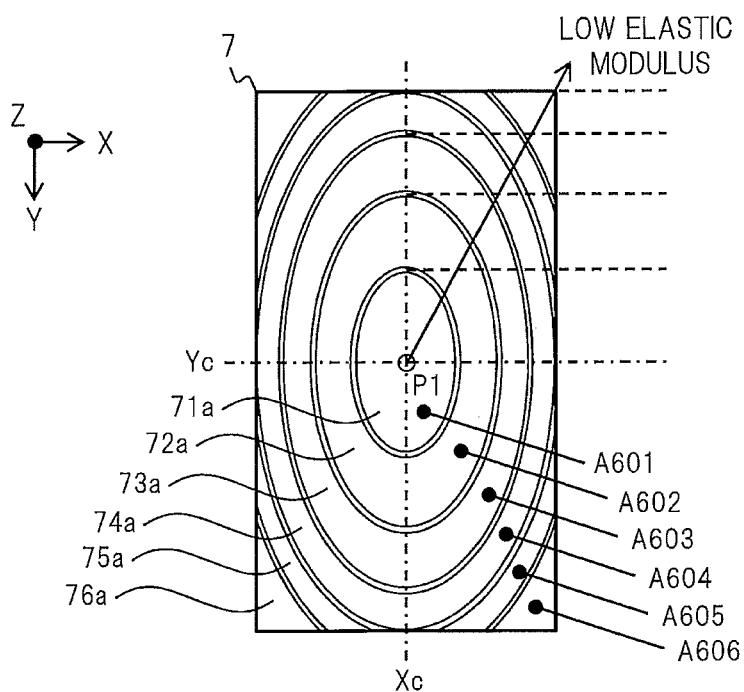
FIG. 19 is a view showing a configuration of a cushion layer in a sixth modification example of the first embodiment.

FIG. 19 shows a sixth modification example of the configuration of the cushion layer 7 as another mode relating to the fifth modification example. In the sixth modification example, the cushion layer 7 is similarly configured of a plurality of kinds of members 71a to 76a, but has a difference that the shape of the members 71a to 76a is not substantially rectangular but substantially oval. A region A601 corresponding to the member 71a is a region having the highest elastic modulus. A region A606 corresponding to the member 76a is a region having the lowest elastic modulus.

[Cushion Layer (4)]

Figure 20A:
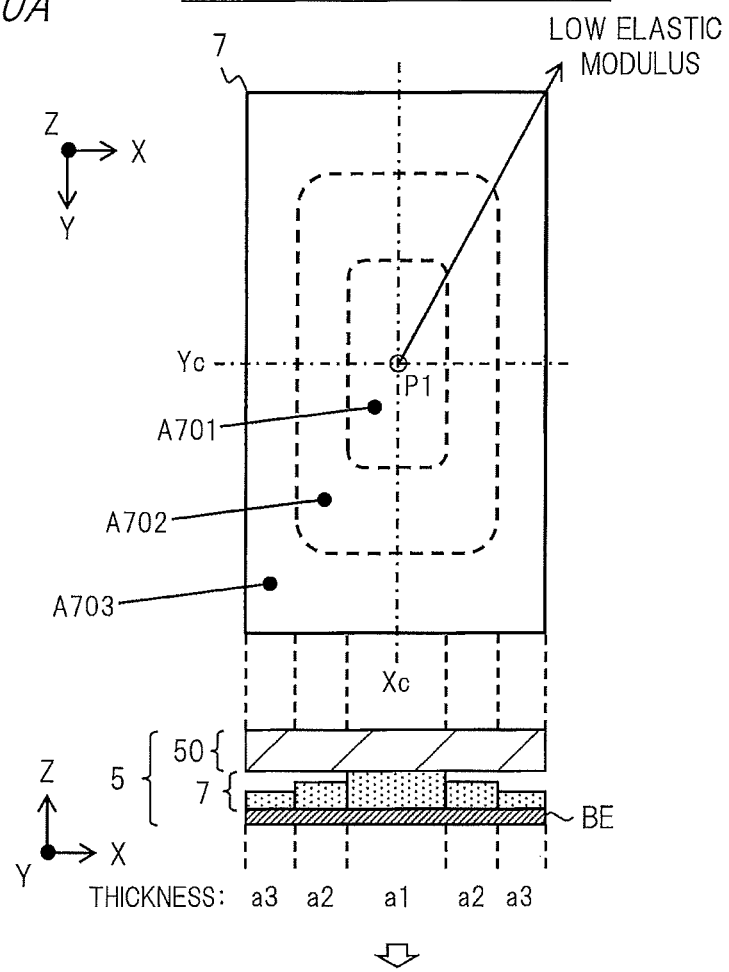
FIG. 20A is a view showing a configuration of a cushion layer in a seventh modification example of the first embodiment.

FIG. 20A shows a seventh modification example relating to the cushion layer 7. In the seventh modification example, a method of changing the elastic modulus by the change in thickness of the cushion layer 7 in the Z direction is adopted as the method for constituting the characteristic. A constituent material of the cushion layer 7 is uniform. Regions A701 to A703 are provided as regions having different elastic moduli in the region of the screen 101. In addition, a cross section of the cushion layer 7 and the like on the XZ plane is shown. The thickness of the cushion layer 7 decreases as approaching the periphery from the center of the screen 101. The thickness of the cushion layer 7 is a1 in the region A701 near the center, is a2 in the region A702, and is a3 in the peripheral region A703, and a1>a2>a3 holds. The cushion layer 7 may be configured of members divided for each region. The elastic modulus is high in the region A701 because the thickness a1 is large, and the elastic modulus is low in the region A703 because the thickness a3 is small.

Figure 20B:
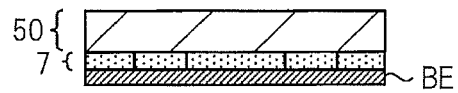
FIG. 20B is a view showing the configuration of the cushion layer in the seventh modification example of the first embodiment.

FIG. 20B shows a concept of a state where the cushion layer 7 is compressed by the elastic deformation from the state of FIG. 20A. A compression ratio is relatively high in the region A701, and the compression ratio is relatively low in the region A703.

Figure 20C:
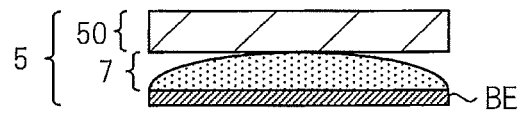
FIG. 20C is a view showing a configuration of a cushion layer in an eighth modification example of the first embodiment.

FIG. 20C shows an eighth modification example of the configuration of the cushion layer 7 as another mode relating to the seventh modification example. In the eighth modification example, the thickness of the cushion layer 7 continuously changes inside the screen 101. The upper surface of the cushion layer 7 does not have a stepped shape but has a curved shape.

[Effect and Others]

As described above, according to the display device of the first embodiment, the higher press detection accuracy can be achieved as uniformly as possible inside the screen 101 by easy operation. In addition, according to the first embodiment, it is possible to reduce the thickness of the module while maintaining predetermined press detection accuracy.

The following is also possible as a modification example of the first embodiment. Namely, the light guide portion 50 is made to have an elastic modulus that is equal to or higher than a certain degree. In this mode, a characteristic of the elastic modulus of the cushion layer 7 is designed in consideration of the elastic modulus of the light guide portion 50 such that the same characteristics as those of the first embodiment can be achieved by the combination of the light guide portion 50 and the cushion layer 7.

[Characteristic Curve (1)]

Figure 21:
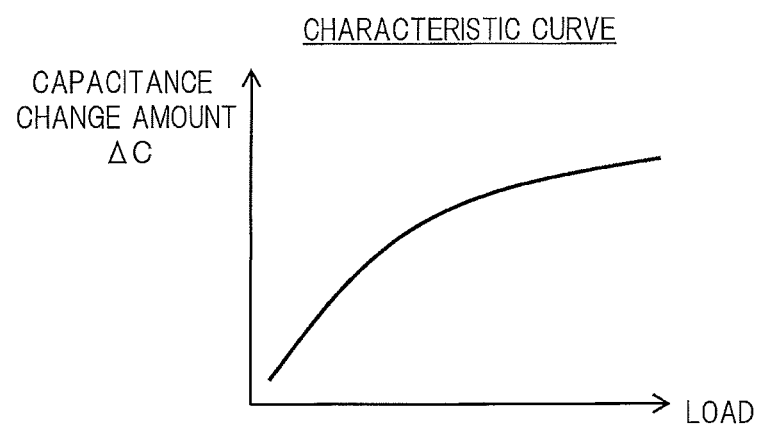
FIG. 21 is a diagram showing an example of a characteristic curve (between load and capacitance change amount) in the first embodiment.

Hereinafter, the effects and others of the first embodiment will be described in more detail. FIG. 21 shows an example of a characteristic of press detection in accordance with the module structure of the display device. Specifically, FIG. 21 shows a characteristic curve representing a relationship between a load corresponding to a pressing force and a capacitance change amount ΔC of a press sensor. This characteristic curve is determined based on the characteristic of elastic deformation in accordance with the module structure. The characteristic curve of FIG. 21 shows the characteristic in the case where a pressing point is the center position inside the screen 101. The capacitance change amount ΔC increases as the pressing load increases. A manner of increase of the capacitance change amount ΔC is not limited to be linear, and may be, for example, non-linear as in FIG. 21. A gradient of increase is large when the load is small, and the gradient of increase is small when the load is large. The characteristic of FIG. 21 represents a characteristic in the case where the elastic deformation terminates without exceeding the air layer 4, and there is no inflection point at which the characteristic greatly changes. When the pressing point is in the periphery of the screen 101, the deflection hardly occurs and the displacement amount ΔZ becomes small, so that the characteristic curve has a shape with a smaller gradient. The IC can calculate the pressing force and the like from the detection value representing the capacitance change amount ΔC by performing operation reflecting such a characteristic.

[Characteristic Curve (2)]

Figure 22:
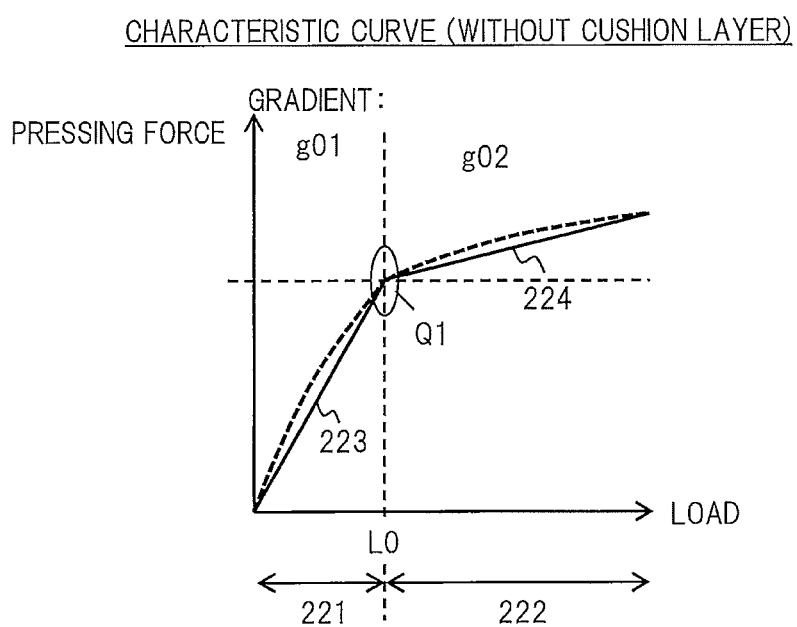
FIG. 22 is a diagram showing an example of a characteristic curve (between load and pressing force) in a case where the cushion layer is not provided as a comparative example to the first embodiment.

FIG. 22 shows a characteristic curve representing a relationship between the load and the pressing force at a certain position inside the screen 101, for example, at the center point P1 in the module according to the first embodiment. The characteristic curve representing a relationship between the load and the capacitance change amount basically has the same shape. The module according to the first embodiment has the structure in which the air layer 4 is present between the liquid crystal panel 3 and the backlight device 5. Thus, the characteristic curve has an inflection point Q1 as shown in FIG. 22, and a load at that time is L0. A range 221 up to the inflection point Q1 corresponds to a range of the first deformation state of FIG. 11 in which the elastic deformation terminates without exceeding the air layer 4. A range 222 after the inflection point Q1 corresponds to a range of the second deformation state in FIG. 12 in which the elastic deformation reaches up to the backlight device 5 and the like beyond the air layer 4. FIG. 22 shows the characteristic in a state where the alleviation and adjustment by the cushion layer 7 are not reflected as a comparative example. The relationship is indicated by a straight line 223 in the range 221. The relationship is indicated by a straight line 224 in the range 222. The gradient of the characteristic curve changes in the range 222 because the elastic deformation of the backlight device 5 is also added. A gradient g01 is relatively large in the straight line 223, and a gradient g02 is relatively small in the straight line 224. Since the pressing force and the capacitance change amount are based on the characteristic shown in FIG. 21, the detailed shape of the characteristic curve can be converted into a curve indicated by a broken line.

[Characteristic Curve (3)]

Figure 23:
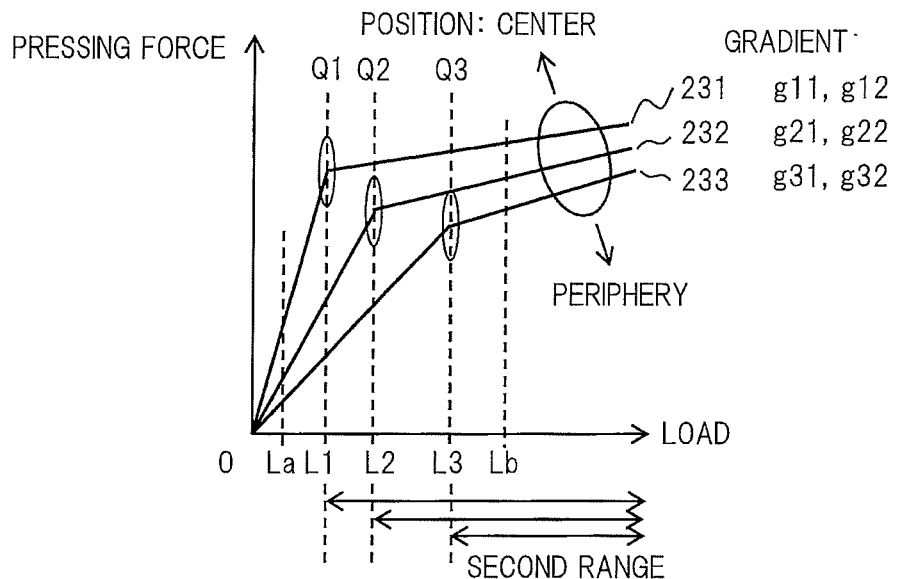
FIG. 23 is a diagram showing an example of a plurality of characteristic curves (between load and pressing force) depending on a pressing position in a case where the cushion layer is not provided as a comparative example to the first embodiment.

FIG. 23 shows characteristic curves depending on a difference in pressing position inside the screen 101. FIG. 23 shows characteristic curves in the mode in which the cushion layer 7 is not provided as a comparative example. In FIG. 23, curves 231, 232, and 233 are shown as characteristic curves depending on the difference in the pressing position on the screen 101. For example, the curve 231 shows a characteristic relating to a detection signal at the center point P1, the curve 232 shows a characteristic relating to a detection signal at the point P4 or the like near the left or right side as a peripheral point close to the frame portion 102, and the curve 233 shows a characteristic relating to a detection signal at the point P2 or the like in the periphery of the upper or lower side. The curves at the respective positions have different inflection points Q1 to Q3. The curve 231 has the inflection point Q1 when the load is L1, the curve 232 has the inflection point Q2 when the load is L2, and the curve 233 has the inflection point Q3 when the load is L3. The respective curves have different shapes such as gradients. In a first range up to each inflection point, the curve 231 has a gradient g11, the curve 232 has a gradient g21, and the curve 233 has a gradient g31. In a second range after each inflection point, the curve 231 has a gradient g12, the curve 232 has a gradient g22, and the curve 233 has a gradient g32. When the load is, for example, La in the first range, a pressing force (corresponding capacitance change amount) of the curve 231 is the largest and a pressing force of the curve 233 is the smallest. When the load is, for example, Lb in the second range, the pressing force of the curve 231 is the largest and the pressing force of the curve 233 is the smallest.

When the characteristic curves are different depending on the pressing position inside the screen 101 as described above, it is necessary to perform different calculations depending on the position inside the screen 101 at the time of calculating the pressing force by the IC based on detection signals from the plurality of drive electrodes VC, and the calculation is not easy. In addition, if the calculation is performed by applying the same simplified characteristic curve regardless of the position inside the screen 101 for the simplification of the operation of the IC, the detection accuracy of the pressing force is not favorable.

Figure 24:
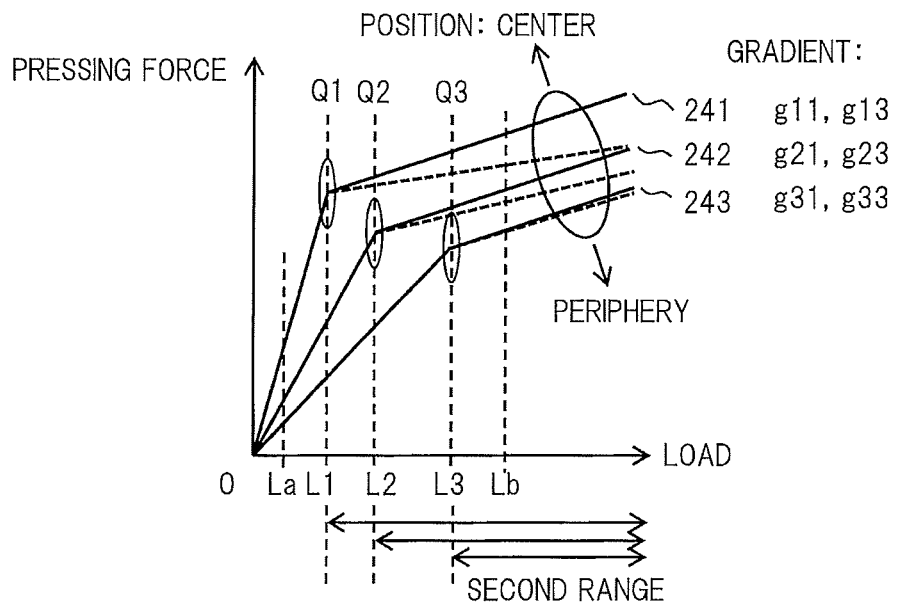
FIG. 24 is a diagram showing an example of a plurality of characteristic curves depending on a pressing position in the first embodiment.

FIG. 24 shows characteristic curves depending on a difference in pressing position inside the screen 101 in the case of the first embodiment in which the cushion layer 7 is provided, with respect to FIG. 23. Curves after adjustment by the cushion layer 7 are shown. Similarly, a curve 241 at a position of the point P1, a curve 242 at a position of the point P4 or the like and a curve 243 at a position of the point P2 or the like are shown. Broken lines indicate the characteristic curves before the adjustment. The same curves as those in FIG. 23 appear in the first range. In the second range, shapes such as gradients of the respective curves are aligned so as to become more uniform than the shapes in FIG. 23 by a buffering effect of elastic deformation by the cushion layer 7. In the second range, the curve 241 has a gradient g13, the curve 242 has a gradient g23, and the curve 243 has a gradient g33. For example, g13>g12, g23>g22, and g33>g32 (g33≈g32) hold.

The influence of the difference in the pressing position is alleviated in the characteristic curves after the adjustment, and the curves approximate to the uniform characteristic. Accordingly, it is possible to apply the calculation based on the same characteristic curve when the pressing force is calculated by the IC based on the signals Sf from the plurality of drive electrodes VC, and the operation is easy. It is unnecessary to perform complicated correction operation, which contributes to faster calculation and the like. It is possible to calculate the pressing force with high accuracy by easy operation. In addition, the gradient is larger and a value range is enlarged in the adjusted curve 241 and the like. Accordingly, it is possible to more finely calculate the pressing force by the IC. At the same time, as will be described later, it is possible to shorten a Z-direction length that needs to be secured for press detection. For example, it is possible to thin or eliminate the air layer 4, which contributes to reduction in thickness of the module. As described above, in the first embodiment, the characteristics of the press detection are adjusted to the favorable characteristics by the physical structure of the module without making the contents of the operation by the IC complicate.

[Characteristic Curve (4)]

Figure 25:
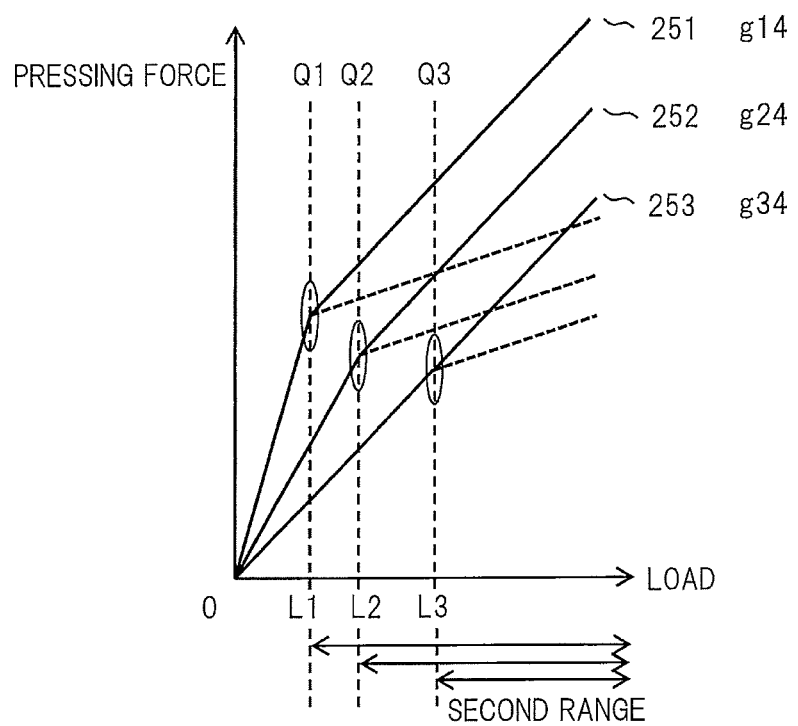
FIG. 25 is a diagram showing an example of a plurality of characteristic curves after performing correction in the first embodiment.

FIG. 25 shows an example of characteristic curves in the case of performing predetermined correction operation as the operation of the IC, with respect to FIG. 24. Curves 251, 252, and 253 are shown as the characteristic curves after correction operation is performed based on the characteristic curves (broken lines) in FIG. 24. As the correction operation, correction for increasing a gradient, correction for converting a curve into a straight line, and the like are performed. After the correction, the curve 251 has a gradient g14, the curve 252 has a gradient g24, and the curve 253 has a gradient g34 in the second range. Since the shapes of the curves before the correction are aligned, the correction operation is easy. In this manner, it is possible to more easily detect the pressing force with high accuracy.

Note that the operation including the correction operation by the IC is not limited to a mode in which the calculation based on a physical relational expression is constantly performed, and may be a mode in which the calculation is simplified or made faster by using a lookup table or the like. In such a case, by performing the calculation in accordance with each input value in advance through experiments or the like to acquire an output value, a relationship between the input value and the output value is stored in a correction operation table or the like. At the time of practical use, a corresponding output value can be extracted by referring to the table based on an input value.

[Characteristic Curve (5)]

Figure 26:
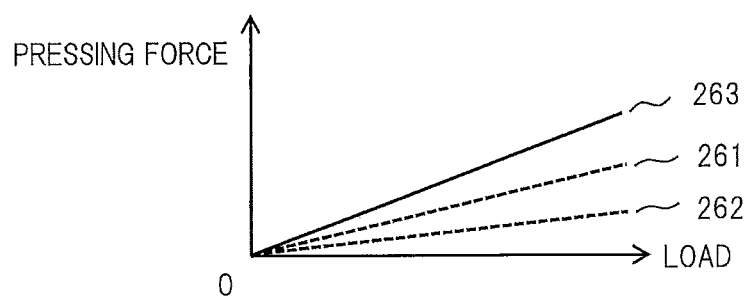
FIG. 26 is a diagram showing an example of characteristic curves in a case where an air layer is not provided as a modification example of the first embodiment.

FIG. 26 shows characteristic curves in a mode in which the air layer 4 is not provided (third embodiment to be described later). There is only the second range in these characteristic curves, and there is no inflection point. A curve 261 shows a characteristic curve when the pressing position is, for example, the center point P1 of the screen 101. A curve 262 shows a characteristic curve when the pressing position is, for example, a point in the periphery of the screen 101. A curve 263 shows a curve after performing the predetermined correction operation based on the curve 261 and the curve 262. It is possible to align the characteristic curves to almost the same characteristic curve regardless of the position as indicated by the curve 263, and thus, the calculation of the pressing force is easy.

[Characteristic Curve (6)]

Figure 27:
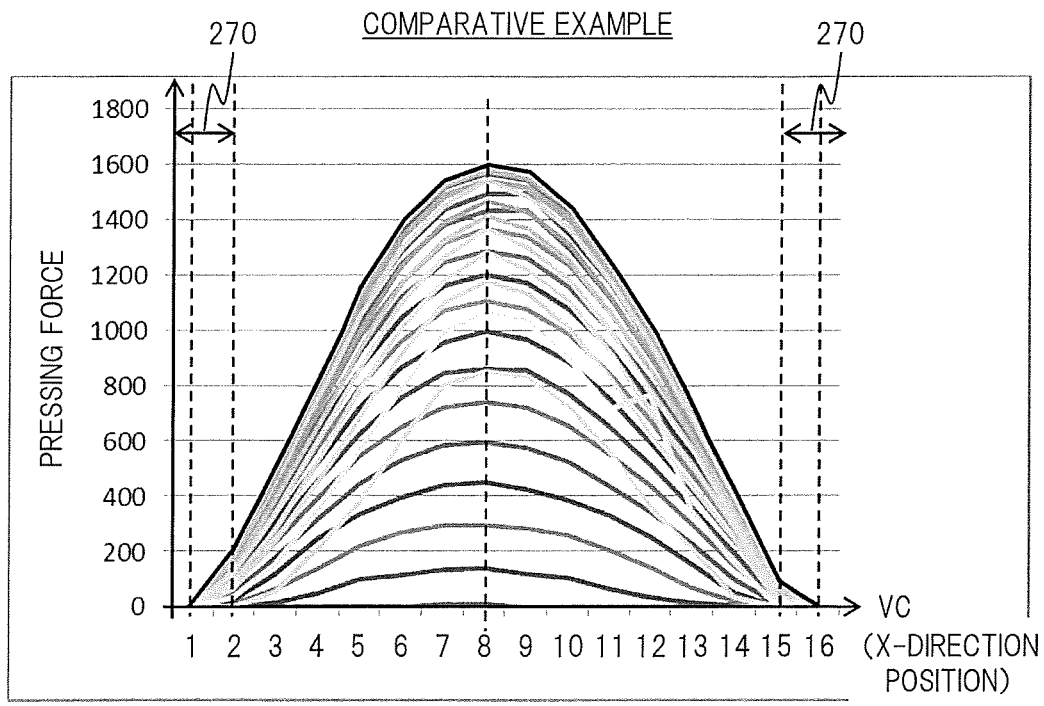
FIG. 27 is a diagram showing an example of a plurality of characteristic curves (between X-direction position and pressing force) depending on a Y-direction position in a case where the cushion layer is not provided as a comparative example to the first embodiment.

FIG. 27 shows a characteristic representing a relationship between an X-direction position (the drive electrode VC) of the screen 101 and a pressing force in the mode in which the cushion layer 7 is not provided as a comparative example. The pressing force indicates a pressing force calculated based on the displacement amount $\Delta Z$ and the capacitance change amount $\Delta C$ depending on the X-direction position. A plurality of curves represent characteristics depending on a Y-direction position (the signal Sp from the scan line GL). The curve with the large maximum value is a curve corresponding to the Y-direction position of the pressing point. In the characteristics, the detection is easy when the pressing position is at the center of the screen 101, but the detection becomes harder as approaching the periphery. In particular, a region 270 indicates a region close to the frame portion 102. Since the position is fixed in the frame portion 102 as described above, the displacement amount $\Delta Z$ and the capacitance change amount $\Delta C$ are small with respect to press, and basically it is difficult to detect the pressing force in the region 270.

Figure 28:
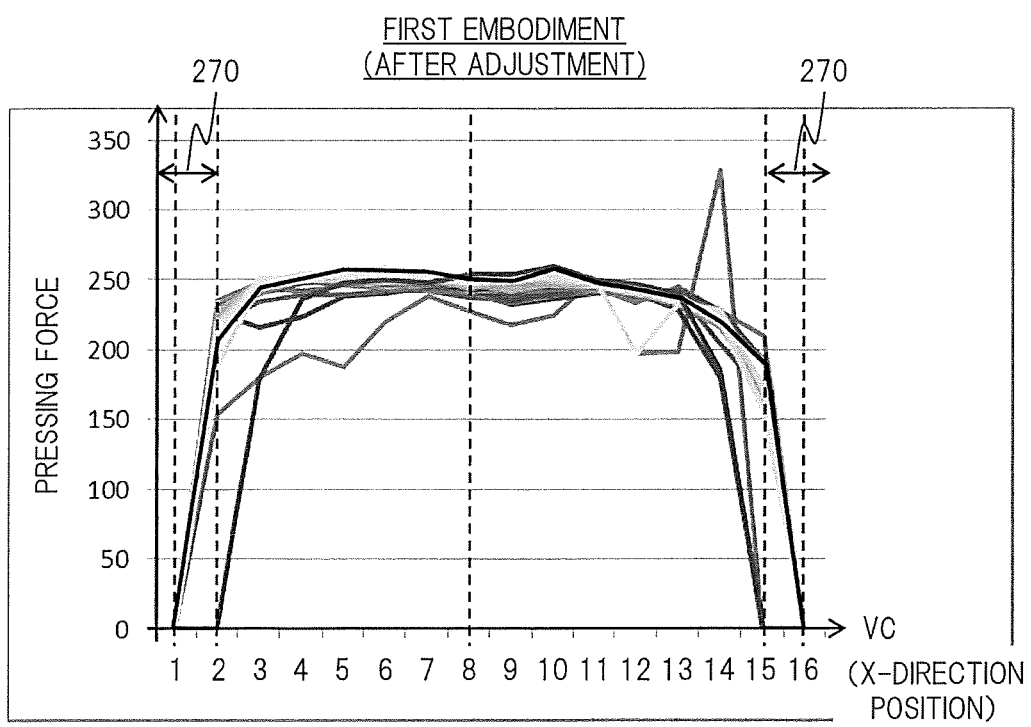
FIG. 28 is a diagram showing an example of a plurality of characteristic curves (between X-direction position and pressing force) depending on a Y-direction position in the first embodiment.

FIG. 28 shows a characteristic representing the relationship between the X-direction position (the drive electrode VC) of the screen 101 and the pressing force in the mode in which the cushion layer 7 is provided according to the first embodiment. A plurality of curves represent characteristics depending on a Y-direction position (the signal Sp from the scan line GL). The characteristics are adjusted by the cushion layer 7, and the values of the pressing force in the plurality of curves approximate to a close value in the center and the periphery of the screen 101 in the X direction. Namely, shapes of the respective curves are almost flat in a range excluding the region 270 close to the frame portion 102. As a modification example, it is also possible to adopt a mode in which a range in which the press of the screen 101 is detectable is defined as the range excluding the region 270.

[Press Detection Signal]

Figure 29:
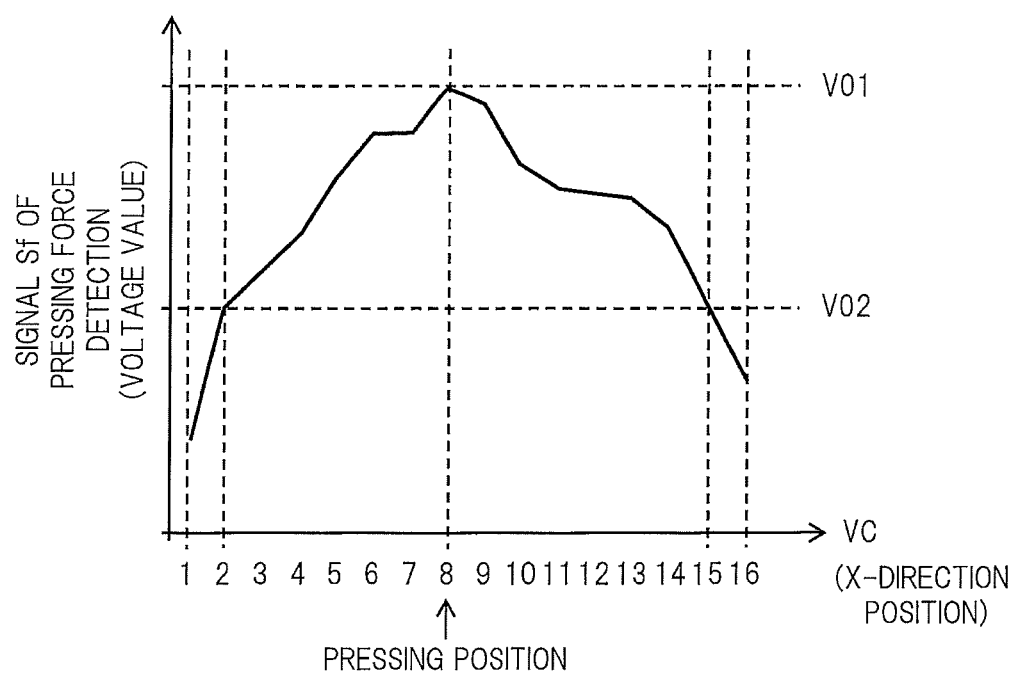
FIG. 29 is a diagram showing a detection value of a pressing force detection signal depending on an X-direction position as a supplement in the first embodiment.

FIG. 29 shows a voltage value of the signal Sf for pressing force detection as a detection signal in a pressing state which corresponds to the first deformation state of FIG. 11 as a supplement. The X-direction position is indicated by an identifier of the drive electrode VC, and there are sixteen drive electrodes VC in this example. A case where the position near the center of the screen 101 in the X direction (for example, a drive electrode VC8) is a pressing point is shown. A voltage value V01 indicates a voltage value corresponding to the change amount of the capacitance C1 of the drive electrode VC8 at the pressing point. A voltage value V02 indicates a voltage value corresponding to the change amount of the capacitance C1 at a position close to the periphery, for example, a drive electrode VC15 in the case of the same pressing point. In this example, the signal Sf from the drive electrode VC8 is the maximum value among the signals Sf from the respective drive electrodes VC. Thus, it can be seen that the X-direction position of the pressing point is the drive electrode VC8. In addition, the Y-direction position of the pressing point can be determined based on a magnitude of the voltage value of the signal Sp from each scan line GL. Accordingly, it is possible to calculate the position coordinate (X0, Y0) of the pressing point P0.

[Z-Direction Length of Elastic Deformation]

Figure 30:
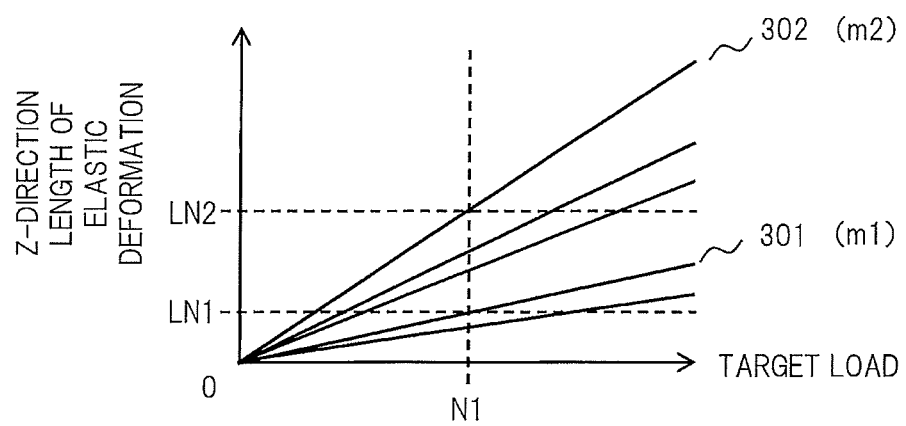
FIG. 30 is a diagram showing a simulation result of a relationship between a target load and a Z-direction length necessary for elastic deformation regarding an effect of the first embodiment.

FIG. 30 is an explanatory diagram regarding the Z-direction length that needs to be secured for elastic deformation in the press detection. FIG. 30 shows a simulation result regarding a relationship between a target load and the Z-direction length necessary for elastic deformation of the module. In the module assumed to be mounted, the thickness of the cover glass 1 is set to a predetermined thickness, and the size of the screen 101 is set to a predetermined size. The target load that is allowed for the press on the screen 101 and is detectable is defined as, for example, a load N1. A plurality of curves are curves depending on a difference in thickness of the cover glass 1. The Z-direction length necessary for elastic deformation is determined depending on the target load.

A curve 301 corresponds to the case where the thickness of the cover glass 1 is set to a first thickness m1. When the target load is N1 in this curve 301, the necessary Z-direction length is a length LN1. This length LN1 can be covered by, for example, the thickness of the air layer 4 of a module of the related art. When the displacement amount of the elastic deformation is large, the capacitance change amount of the capacitance C1 is large, and noise resistance is enhanced, which is convenient from the viewpoint of press detection accuracy. Thus, the drive electrode VC and the base electrode BE are arranged at positions relatively far from each other.

When it is desired to achieve the reduction in thickness of the module, for example, the thickness of the cover glass 1 is made smaller than that of the related art. A curve 302 corresponds to the case where the thickness of the cover glass 1 is set to a second thickness m2 (m2<m1). In this case, when it is desired to secure a range of a detectable pressing force equal to that in the related art, the displacement amount of elastic deformation needs to be increased in such members as the liquid crystal panel 3 and the air layer 4 because the cover glass 1 becomes thinner. When the target load is N1 in this curve 302, the necessary Z-direction length is a length LN2 (LN2>LN1). It becomes more difficult to achieve the reduction in thickness of the module as the Z-direction length necessary for elastic deformation increases. For example, the Z-direction length of the air layer 4 increases in order to secure the length LN2. For that reason, it is necessary to devise an additional means and idea in order to achieve the reduction in thickness of the module.

When the Z-direction length necessary for elastic deformation cannot be covered by the air layer 4, the elastic deformation reaches up to the backlight device 5 as in the first embodiment. Thus, in the first embodiment, the elastic deformation is buffered not only by the air layer 4 but also by the cushion layer 7 of the backlight device 5. As shown in FIG. 24 described above, the adjustment is performed such that the gradients of the characteristic curves are aligned by the effect of the cushion layer 7. Since the cushion layer 7 is provided in the first embodiment, the thickness of the air layer 4 can be reduced as compared with the related art, or the air layer 4 can be eliminated. Accordingly, it is possible to reduce the Z-direction length required for press detection in the entire module, and it is possible to achieve the reduction in thickness.

Second Embodiment

Figure 31:
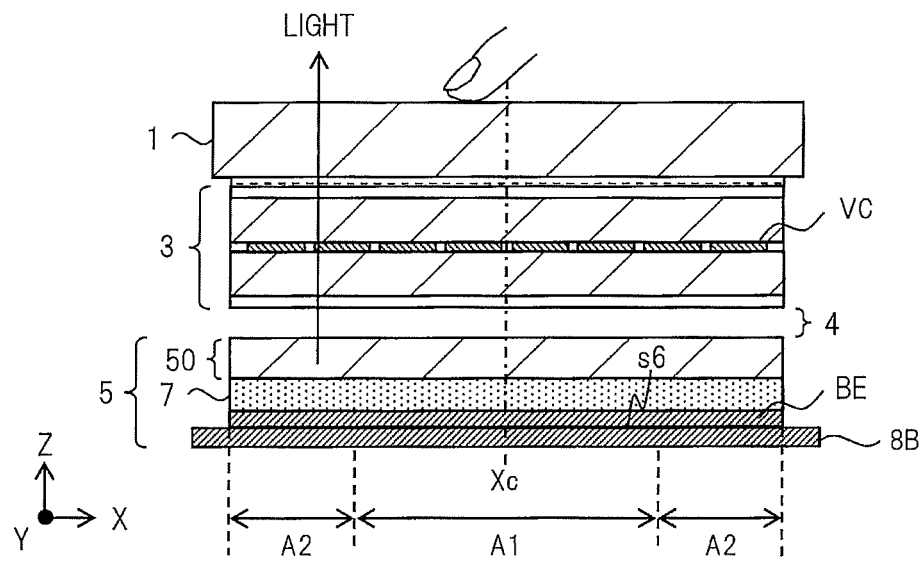
FIG. 31 is a view showing a cross section of a module on an XZ plane as a configuration of a display device according to a second embodiment of the present invention.

FIG. 31 shows a cross section on the XZ plane as a configuration of a display device according to a second embodiment. Hereinafter, differences in configuration from the first embodiment will be described in the second embodiment and the like. The display device according to the second embodiment is provided with a base electrode BE that is separated from a case 8B which is a housing of the backlight device 5. The base electrode BE is formed on an inner surface s6 of the case 8B. The cushion layer 7 is provided on the base electrode BE. The case 8B has predetermined rigidity. In this configuration, the base electrode BE is formed and supported on the surface of the rigid case 8B having rigidity, and thus, does not necessarily have predetermined rigidity. The base electrode BE can be made of metal such as aluminum that has high conduction efficiency and can be formed at low cost. The base electrode BE may be formed by, for example, attaching a conductive film to the case 8B or the like. An adhesive layer or the like may be interposed between the base electrode BE and the case 8B or an insulating film or the like may be provided on the base electrode BE.

According to the second embodiment, the same effects as in the first embodiment can be obtained. As a modification example of the second embodiment, the base electrode BE may be formed on an outer surface of the case 8B. In addition, a shape of the base electrode BE is not limited to a solid layer on the XY plane that covers the screen 101, and may be configured of, for example, a predetermined pattern (for example, a stripe shape or a matrix shape) or the like formed by a plurality of electrodes.

Third Embodiment

Figure 32:
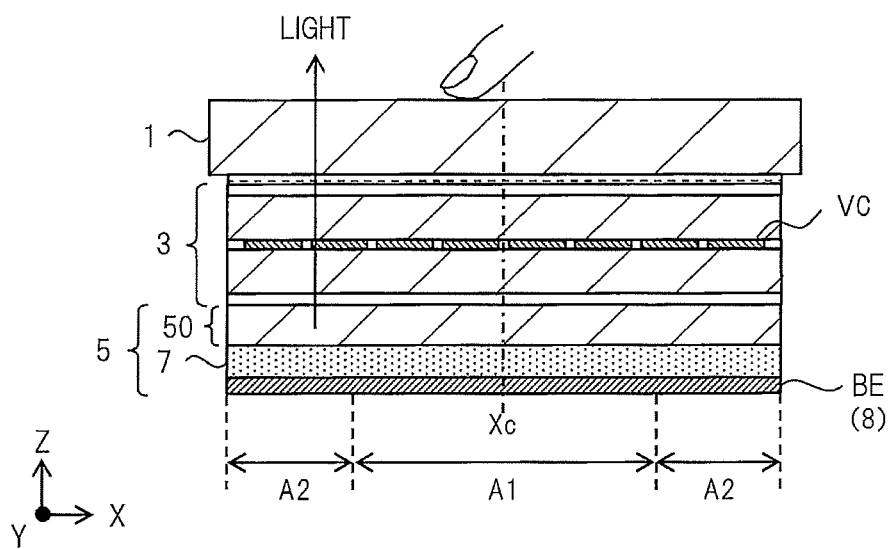
FIG. 32 is a view showing a cross section of a module on an XZ plane as a configuration of a display device according to a third embodiment of the present invention.

FIG. 32 shows a cross section on the XZ plane as a configuration of a module of a display device according to a third embodiment. The module of the display device according to the third embodiment has a difference in configuration that the air layer 4 between the liquid crystal panel 3 and the backlight device 5 is eliminated. Namely, the above-described surface s2 and surface s3 are in contact with each other from the beginning. In this mode, parts such as the cover glass 1, the liquid crystal panel 3, and the light guide portion 50 are integrally elastically deformed when being pressed. The elastic deformation thereof is directly received and buffered by the cushion layer 7 to adjust the characteristic. The characteristic is shown by a curve with no inflection point.

According to the third embodiment, the same effects as in the first embodiment can be obtained. Since the air layer 4 is not provided, the operation by the IC becomes easier, and it is possible to contribute to the reduction in thickness of the module. Note that a mode in which an elastic layer having a sufficiently low elastic modulus and a small thickness is interposed instead of the air layer 4 is also possible.

Fourth Embodiment

Figure 33:
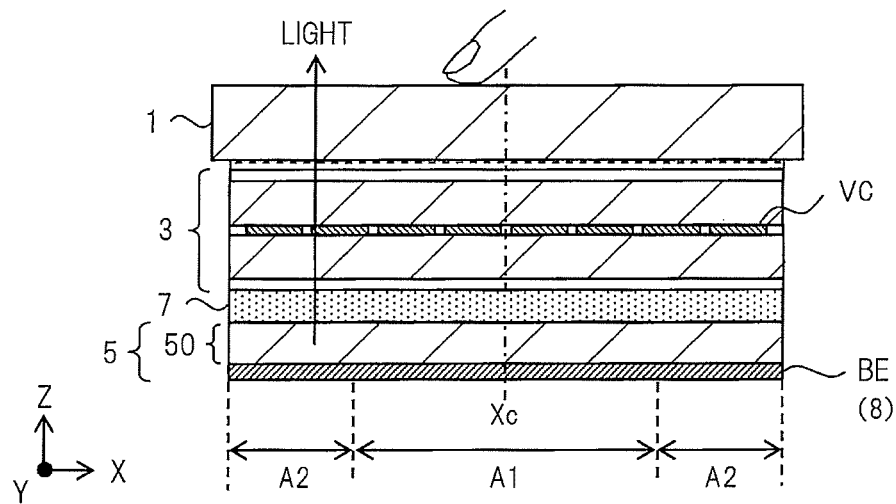
FIG. 33 is a view showing a cross section of a module on an XZ plane as a configuration of a display device according to a fourth embodiment of the present invention.

FIG. 33 shows a cross section on the XZ plane as a configuration of a module of a display device according to a fourth embodiment. In the fourth embodiment, the cushion layer 7 is provided between the liquid crystal panel 3 and the light guide portion 50 of the backlight device 5. A metal plate 8 is provided below the light guide portion 50. In this configuration, however, the cushion layer 7 is configured of a member having light permeability so as to transmit backlight.

According to the fourth embodiment, the same effects as in the first embodiment can be obtained. In addition, a mode in which the air layer 4 is further provided between the liquid crystal panel 3 and the cushion layer 7 is also possible.

Fifth Embodiment

Figure 34:
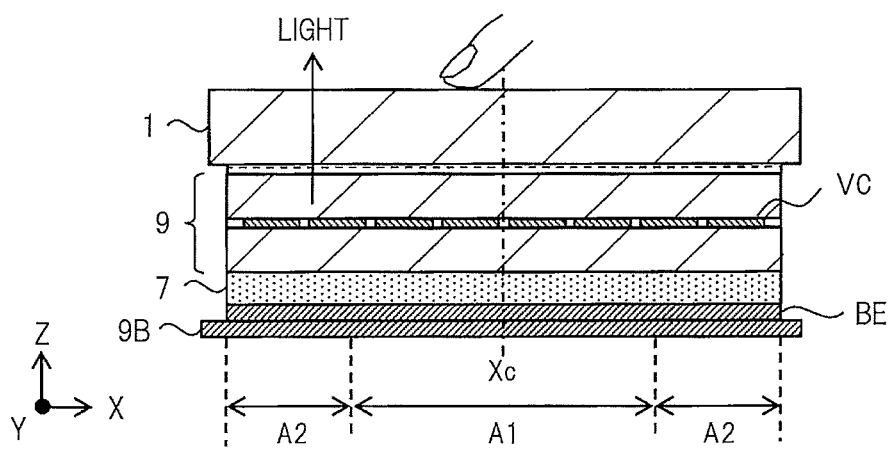
FIG. 34 is a view showing a cross section of a module on an XZ plane as a configuration of a display device according to a fifth embodiment of the present invention.

FIG. 34 shows a cross section on the XZ plane as a configuration of a module of a display device according to a fifth embodiment. The display device of the fifth embodiment is an organic EL display device including an organic EL panel 9 instead of the liquid crystal panel 3. The organic EL panel 9 can be configured by applying a known technique. The organic EL panel 9 includes a light-emitting element containing organic compound as a display function layer. The drive electrode VC and the like are similarly formed inside the organic EL panel 9. The organic EL panel 9 is a self-luminous display device and does not use the backlight device 5. The cushion layer 7 is provided to be in contact with a lower side of the organic EL panel 9 in the Z direction. The base electrode BE is provided below the cushion layer 7. For example, the base electrode BE is formed on an upper surface of a housing 9B constituting the module. The base electrode may be provided integrally with the housing 9B. As a modification example, the air layer 4 may be provided between the organic EL panel 9 and the cushion layer 7. According to the fifth embodiment, the same effects as in the first embodiment can be obtained in the organic EL display device.

In the foregoing, the present invention has been specifically described based on the embodiments, but the present invention is not limited to the above-described embodiments, and various modifications can be made without departing from a gist thereof. It is understood that a person skilled in the art can derive various kinds of modifications and corrections in the scope of the idea of the present invention, and these modifications and corrections are encompassed within the scope of the present invention. For example, the embodiments obtained by performing addition or elimination of components or design change or the embodiments obtained by performing addition or reduction of process or condition change to the embodiments described above by a person skilled in the art are also included in the scope of the present invention as long as they include the gist of the present invention. Although the liquid crystal display device has been described as a disclosed example in the above-described embodiments, the present invention can be applied without being limited thereto. The invention can be applied to, for example, an organic EL display device, other self-luminous display devices, an electronic paper display device, a flat panel display device, and the like. In addition, the present invention can be applied to a small size to a large size without particular limitation.

What is claimed is:

1. A display device to detect a press on a screen, the display device comprising:
    a display panel that performs display on the screen, which is provided inside a frame portion and receives the press;
    a plurality of plate-shaped drive electrodes that are arranged in a region corresponding to the screen in the display panel;
    a solid base electrode that is arranged in the region corresponding to the screen at a position spaced apart from the drive electrode of the display panel on a back side in a thickness direction; and
    an elastic layer that is arranged between the display panel and the base electrode in the thickness direction,
    wherein the elastic layer includes a central region and a peripheral region peripheral to the central region in the region corresponding to the screen in plan view in the thickness direction, and an elastic modulus decreases from the central region to the peripheral region.

2. The display device according to claim 1, wherein the elastic layer is constituted by a variation in a material characteristic.

3. The display device according to claim 1, wherein the elastic layer is constituted by a variable distribution of material density.

4. The display device according to claim 3, wherein the variable distribution of the material density is achieved by a variable distribution of a density of holes, grooves, or bubbles formed in the elastic layer.

5. The display device according to claim 1, wherein the elastic layer includes a plurality of members having different elastic moduli.

6. The display device according to claim 1, wherein the elastic layer is constituted by a variable distribution of material thickness.

7. The display device according to claim 1,
    wherein the display panel is a liquid crystal panel,
    a backlight device is arranged on a back side of the liquid crystal panel in the thickness direction, and
    the base electrode is configured as a metal plate of a housing constituting the backlight device.

8. The display device according to claim 1,
    wherein the display panel is an organic EL panel,
    the base electrode is configured as a metal plate of a housing constituting the display device or is formed in the housing, and
    the elastic layer is arranged between the organic EL panel and the base electrode in the thickness direction.

9. The display device according to claim 1, wherein a characteristic of the elastic modulus in the region corresponding to the screen brings a difference in a pressing force characteristic that depends on a pressing position in the region corresponding to the screen closer to a more uniform characteristic, thereby enlarging a value range of the pressing force.

10. The display device according to claim 9, wherein, in the region corresponding to the screen, the characteristic of the elastic modulus is set, except in a partial region close to the frame portion.

* * * * *